(12) United States Patent
Sasaki et al.

(10) Patent No.: US 9,029,270 B2
(45) Date of Patent: May 12, 2015

(54) PHENOLIC RESIN COMPOSITION, AND METHODS FOR MANUFACTURING CURED RELIEF PATTERN AND SEMICONDUCTOR

(75) Inventors: Takahiro Sasaki, Toyko (JP); Jun Li, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 0 days.

(21) Appl. No.: 13/820,772

(22) PCT Filed: Sep. 12, 2011

(86) PCT No.: PCT/JP2011/070750
§ 371 (c)(1),
(2), (4) Date: Mar. 5, 2013

(87) PCT Pub. No.: WO2012/036130
PCT Pub. Date: Mar. 22, 2012

(65) Prior Publication Data
US 2013/0168829 A1    Jul. 4, 2013

(30) Foreign Application Priority Data

Sep. 15, 2010 (JP) ................................. 2010-206427
Nov. 17, 2010 (JP) ................................. 2010-257006

(51) Int. Cl.
| | |
|---|---|
| *H01L 21/461* | (2006.01) |
| *G03F 7/004* | (2006.01) |
| *C08L 61/34* | (2006.01) |
| *C08G 61/02* | (2006.01) |
| *H01L 21/30* | (2006.01) |
| *H01L 29/06* | (2006.01) |
| *C08K 5/42* | (2006.01) |
| *G03F 7/023* | (2006.01) |
| *G03F 7/038* | (2006.01) |

(52) U.S. Cl.
CPC ................. *G03F 7/004* (2013.01); *C08L 61/34* (2013.01); *C08G 61/02* (2013.01); *C08G 2261/3424* (2013.01); *H01L 21/30* (2013.01); *H01L 29/06* (2013.01); *C08K 5/42* (2013.01); *G03F 7/0236* (2013.01); *G03F 7/038* (2013.01)

(58) Field of Classification Search
USPC ............. 438/780, 781, 789; 522/69; 430/269, 430/270.1
See application file for complete search history.

(56) References Cited

U.S. PATENT DOCUMENTS

| | | | |
|---|---|---|---|
| 7,015,256 B2 * | 3/2006 | Ito et al. ........................... | 522/81 |
| 2004/0043327 A1 | 3/2004 | Sugano et al. | |
| 2006/0199099 A1 | 9/2006 | Arao et al. | |
| 2006/0240356 A1 | 10/2006 | Sugano et al. | |

FOREIGN PATENT DOCUMENTS

| | | | |
|---|---|---|---|
| JP | 10-78656 A | | 3/1998 |
| JP | 2003-82025 A | | 3/2003 |
| JP | 2003-215789 A | | 7/2003 |
| JP | 2004-514173 A | | 5/2004 |
| JP | 2006-243161 A | | 9/2006 |
| JP | 2007-57595 A | | 3/2007 |
| JP | 2008-45086 A | | 2/2008 |
| JP | 2008-292677 A | | 12/2008 |
| JP | 2009025325 A | * | 2/2009 |
| JP | 2009031404 A | * | 2/2009 |
| JP | 2009-237125 A | | 10/2009 |
| WO | 02/41079 A2 | | 5/2002 |

OTHER PUBLICATIONS

Search report from International Patent Appl. No. PCT/JP2011/070750, mail date is Dec. 13, 2011.

* cited by examiner

*Primary Examiner* — Brook Kebede
(74) *Attorney, Agent, or Firm* — Greenblum & Bernstein, P.L.C.

(57) ABSTRACT

Provided is a photopolymer composition for a semiconductor element surface protective film or an interlayer insulating film, in which a solution of the photopolymer composition comprises 100 parts by mass of (A) a phenolic resin having a biphenyldiyl structure in a main chain of the resin; 1 to 30 parts by mass of (B) a photo acid-generating agent; and 1 to 60 parts by mass of (C) a compound that can be reacted with ingredient (A) by means of an acid generated from the photo acid-generating agent or heat.

19 Claims, No Drawings

PHENOLIC RESIN COMPOSITION, AND METHODS FOR MANUFACTURING CURED RELIEF PATTERN AND SEMICONDUCTOR

TECHNICAL FIELD

A first aspect of the present invention relates to a photopolymer composition for a semiconductor element surface protective film or an interlayer insulating film. More particularly, the invention relates to a relief pattern forming material for a surface protective film (a buffer coat film) of a semiconductor element, or the like, or an interlayer insulating film (a passivation film), or the like; a method for manufacturing a relief pattern by using the relief pattern forming material; and a semiconductor device having the relief pattern.

A second aspect of the present invention relates to a phenolic resin composition useful for forming a surface protective film, an interlayer insulating film, or the like in a semiconductor device, a method for manufacturing a highly heat-resistant cured relief pattern using the composition, and a semiconductor device having the cured relief pattern.

BACKGROUND ART

Conventionally, to form a surface protective film and an interlayer insulating film of semiconductor devices, polyimide resin or polybenzoxazole resin is widely used that has all of excellent heat resistance, electrical properties, mechanical properties, and the like. These resins are less soluble in various solvents and therefore generally used as a composition prepared by dissolving a precursor of the resins in a solvent. Accordingly, a step of cyclizing the precursor is necessary when used. The cyclization step is carried out by thermal curing for heating the precursor to usually 300° C. or higher.

In recent years, however, semiconductor devices less heat-resistant than conventional ones have been developed, and there is thus a desire to lower thermal curing temperatures for a surface protective film material or an interlayer insulating film material. Particularly, thermal curability at 250° C. or lower is often desired.

In order to satisfy such a desire, Patent Literature 1 and 2 below each propose a material that does not need the cyclization step and is excellent in cost performance and photosensitivity, which is prepared by using a phenolic resin obtained from the condensation of phenols and aldehydes widely used as base resins in the field of resists, and crosslinkable microparticles or a core-shell polymer, which can be added to improve thermal shock resistance of the phenolic resin.

Additionally, in Patent Literature 3 below, upon synthesis of a phenolic resin, to improve the thermal shock resistance of the phenolic resin, at least one substituted xylene compound selected from the group consisting of an $\alpha,\alpha'$-dihaloxylene compound, an $\alpha,\alpha'$-dihydroxyxylene compound, and an $\alpha,\alpha'$-dialkoxyxylene compound is used instead of an aldehyde compound. Patent Literature 3 proposes a material obtained from the condensation of the substituted xylene compound and a phenolic compound.

Furthermore, Patent Literature 4 below describes a material prepared by using both of a phenolic resin having a condensation product of a biphenyl compound with a phenol in a skeleton thereof, and a photo acid-generating agent. However, in Patent Literature 4, the material is disclosed as one for forming a liquid crystal alignment control protrusion and/or a spacer, or as one for forming a liquid crystal alignment control protrusion and a spacer simultaneously.

However, even if any of these materials is applied to a semiconductor device, as a surface protective film or an interlayer insulating film, the reliability thereof is low. Therefore, it has been difficult to use the materials as alternatives to polyimide resin and polybenzoxazole resin.

PRIOR ART REFERENCES

Patent Literature

[Patent Literature 1]: Japanese Laid-open Patent Publication No. 2003-215789
[Patent Literature 2]: Japanese Laid-open Patent Publication No. 2009-237125
[Patent Literature 3]: Japanese Laid-open Patent Publication No. 2007-057595
[Patent Literature 4]: Japanese Laid-open Patent Publication No. 2008-292677

SUMMARY OF THE INVENTION

Problems to be Solved by the Invention

The material disclosed in Patent Literature 1 or 3 above has improved thermal shock resistance, whereas no consideration has been given to elongation, which is one of film properties important when the material is applied to semiconductor devices, as a surface protective film or interlayer insulating film.

In view of the circumstances described above, according to a first aspect of the present invention, the problem to be solved by the invention is to provide a phenolic resin composition that has high elongation even when thermally cured at 250° C. or lower for application to a semiconductor device and can be an alternative material to polyimide resin and polybenzoxazole resin, a method for manufacturing a cured relief pattern using the composition, and a semiconductor device comprising the cured relief pattern.

According to a second aspect of the present invention, the problem to be solved by the invention is to provide a phenolic resin composition that has high reliability even when thermally cured at 250° C. or lower for application to a semiconductor device and that can be an alternative material to polyimide resin and polybenzoxazole resin, a method for producing a cured relief pattern using the composition, and a semiconductor device comprising the cured relief pattern.

Means for Solving the Problems

The present inventors conducted extensive research and repetitive experiments to solve the problems and, as a result, unexpectedly found out a material capable of forming a semiconductor protective film or interlayer insulating film having excellent elongation even at the low thermal curing temperature of 250° C. or lower when applied to a semiconductor device, thereby completing the first aspect of the present invention.

Specifically, the first aspect of the invention is as follows:
[1] A photopolymer composition for a semiconductor element surface protective film or an interlayer insulating film, a solution of the photopolymer composition comprising the following ingredients:

100 parts by mass of (A) a phenolic resin having a biphenyldiyl structure in a main chain of the resin;
1 to 30 parts by mass of (B) a photo acid-generating agent; and
1 to 60 parts by mass of (C) a compound that can be reacted with ingredient (A) by means of an acid generated from ingredient (B) or heat.

[2] The photopolymer composition according to [1], in which phenolic resin (A) comprises a repeating unit represented by the following general formula (1):

[Chemical Formula 1]

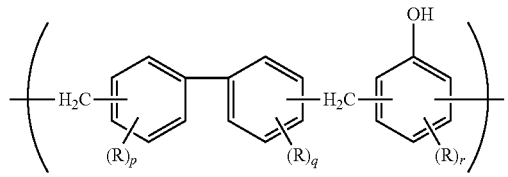

(in which R is a group selected from the group consisting of a halogen atom, a carboxyl group, a hydroxyl group, an aliphatic group having 1 to 10 carbon atoms, which may have an unsaturated bond, an alicyclic group having 3 to 10 carbon atoms, and an aromatic group having 6 to 20 carbon atoms; a hydrogen atom of each group may be additionally substituted with a halogen atom, a carboxyl group and/or a hydroxyl group; p and q are an integer of 0 to 4; r is an integer of 0 to 3; and when p, q, or r is 2 or larger, each R may be the same as or different from the other).

[3] The photopolymer composition according to [1] or [2], in which the number of repeats of the repeating unit in phenolic resin (A) is from 8 to 100.

[4] The photopolymer composition according to any one of [1] to [3], in which photo acid-generating agent (B) is an ester compound made from a phenolic compound and 1,2-naphthoquinone-2-diazide-5-sulfonic acid or 1,2-naphthoquinone-2-diazide-4-sulfonic acid.

[5] The photopolymer composition according to any one of [1] to [4], in which photo acid-generating agent (B) is a compound represented by the following formula:

[Chemical Formula 2]

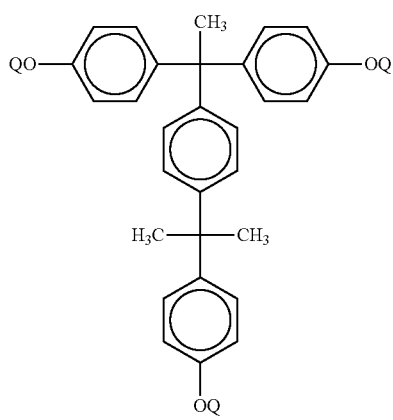

-continued

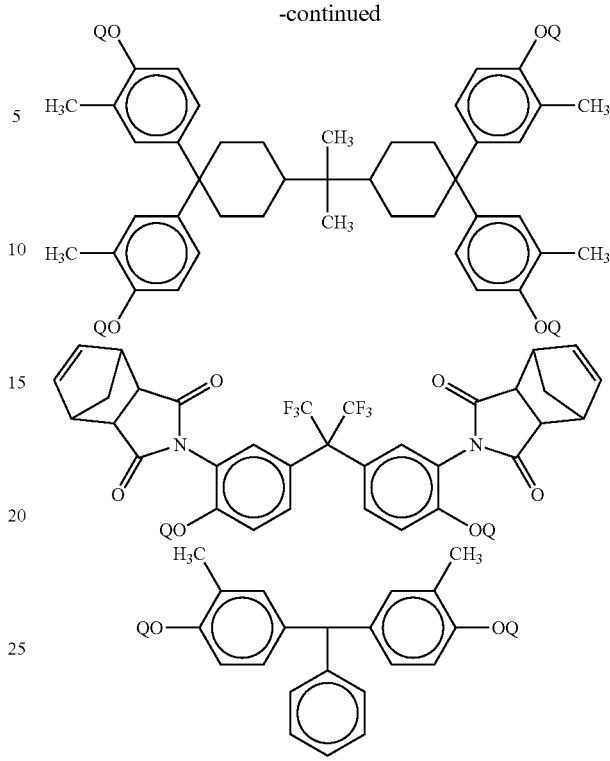

(in which Q is a hydrogen atom or a naphthoquinonediazide sulfonate group represented by the following formula:

[Chemical Formula 3]

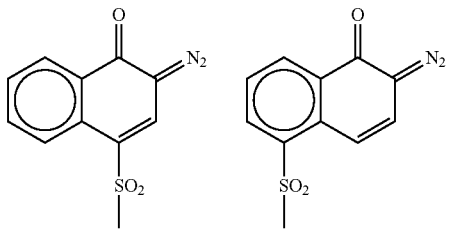

and all Qs are not simultaneously hydrogen atoms).

[6] The photopolymer composition according to any one of [1] to [5], in which compound (C) has at least two groups selected from the group consisting of an epoxy group, an oxetane group, a —N—(CH$_2$—OR') group (in which R' is hydrogen or an alkyl group having 1 to 4 carbon atoms), and a —C—(CH$_2$—OR') group (in which R' is hydrogen or an alkyl group having 1 to 4 carbon atoms).

[7] The photopolymer composition according to any one of [1] to [6], further comprising (D) a thermal base-generating agent.

[8] A method for manufacturing a semiconductor device, comprising the following steps of:
forming a photopolymer layer consisting of the photopolymer composition according to any one of [1] to [7] on a semiconductor substrate;
exposing the photopolymer layer to actinic light;
developing the exposed photopolymer layer to obtain a relief pattern; and
heating the obtained relief pattern.

[9] A semiconductor device manufactured by the method according to [8].

[10] A method for manufacturing a semiconductor element surface protective film or an interlayer insulating film using the photopolymer composition according to any one of [1] to [7].

[11] A use of the photopolymer composition according to any one of [1] to [7] for manufacturing a semiconductor element surface protective film or an interlayer insulating film.

In addition, the present inventors found that, in order to provide a material capable of forming a highly reliable film even at a low thermal curing temperature, such as 250° C. or lower when applied to a semiconductor device, a tensile elongation of a thermally cured film needs to have a specific value or higher, resulting in the accomplishment of a second aspect of the present invention.

Specifically, the second aspect of the present invention is as follows:

[1] A phenolic resin composition comprising a phenolic resin and a solvent, the phenolic resin composition characterized in that, when the composition is spin-coated on a silicon wafer; the silicon wafer and the spin-coated film are heated at 100° C. for three minutes on a hot plate; the spin-coated film is cured at 250° C. for one hour under a nitrogen atmosphere to obtain a cured product having a thickness of 10 μm; the cured product is cut with a width of 3 mm by a dicing saw and treated with a 23% by mass of hydrofluoric acid aqueous solution to separate the silicon wafer; the cured and cut film is allowed to stand for 24 hours or longer in an atmosphere having a temperature of 23° C. and a humidity of 50% to obtain 20 samples; and the 20 samples are measured by a tensile tester, and an average of five highest values of tensile elongation in the samples is 20% or more.

[2] The phenolic resin composition according to [1], in which the average of the five highest values of tensile elongation in the samples is 50% or more.

[3] The phenolic resin composition according to [1] or [2], in which an average of five lowest values of Young's modulus in the samples is below 4.0 GPa.

[4] The phenolic resin composition according to any one of [1] to [3], in which, in a repeating unit of the phenolic resin, a proportion of the number of oxygen atoms and nitrogen atoms to the number of carbon atoms is 0.1 or lower.

[5] The phenolic resin composition according to any one of [1] to [4], further comprising a crosslinking agent.

[6] The phenolic resin composition according to any one of [1] to [5], further comprising a photosensitizer.

[7] A method for manufacturing a cured relief pattern, comprising a step of applying the phenolic resin composition according to any one of [1] to [5] on a substrate to form a relief pattern and a step of heating the relief pattern to form a cured relief pattern.

[8] A method for manufacturing a cured relief pattern, comprising a step of applying the phenolic resin composition according to [6] on a substrate, a step of exposing the phenolic resin composition to light, a step of developing the exposed phenolic resin composition to form a relief pattern, and a step of heating the relief pattern to form a cured relief pattern.

[9] A semiconductor device comprising a semiconductor element and a cured film provided on a top part of the semiconductor element, the semiconductor device characterized in that the cured film is a cured relief pattern obtained by the manufacturing method according to [7] or [8].

[10] A use of the phenolic resin composition according to any one of [1] to [6] for manufacturing a semiconductor element surface protective film or an interlayer insulating film.

Advantages of the Invention

According to the first aspect of the present invention, by using the photopolymer composition of the present invention that can be cured at low temperature and is excellent in the cured film mechanical properties, such as elongation, there can be manufactured a highly reliable semiconductor element and a highly reliable semiconductor device using the semiconductor element.

According to the second aspect of the present invention, thermal curing temperature for forming a surface protective film or an interlayer insulating film of a semiconductor device can be set to a relatively low temperature (for example, 250° C. or lower). Additionally, according to the present invention, cracks in the surface protective film or the interlayer insulating film can be reduced to enhance the reliability of the film, as well as the reliability of a semiconductor device including the film can also be enhanced.

MODES FOR CARRYING OUT THE INVENTION

<Photopolymer Composition>

A photopolymer composition according to the first aspect of the present invention (hereinafter also referred to as simply "first composition") is characterized in that a solution of the composition comprises the following ingredients (A) to (C): 100 parts by mass of (A) a phenolic resin having a biphenyldiyl structure in a main chain of the resin; 1 to 30 parts by mass of (B) a photo acid-generating agent; and 1 to 60 parts by mass of (C) a compound that can be reacted with ingredient (A) by acid generated from ingredient (B) or heat.

Hereinafter, the individual ingredients of the first composition will be described in detail. However, the descriptions thereof are exemplary and the first aspect of the present invention is not limited thereto.

[(A) Phenolic Resin Having Biphenyldiyl Structure in the Main Chain Thereof]

The phenolic resin (A) having a biphenyldiyl structure in the main chain of the resin (hereinafter referred to as simply "biphenyldiyl-phenolic resin") used in the first composition is a polymer comprising a repeating unit having a phenol structure and a biphenyldiyl structure. The phenol structure and the biphenyldiyl structure may be bonded to each other in an arbitrary order. From a viewpoint of further elongation, preferably, the phenol structure and the biphenyldiyl structure are bonded to each other via a methylene group.

The biphenyldiyl-phenolic resin may also have, other than the phenol structure and the biphenyldiyl structure, an alkylene structure having 20 or less carbon atoms, for example, a structure of methylene, ethylene, or the like.

The biphenyldiyl-phenolic resin can be manufactured by an arbitrary known method. The known method includes, for example, a condensation reaction between a compound having a biphenyldiyl structure (hereinafter also referred to as simply "biphenyldiyl compound") and a phenolic compound.

Biphenyldiyl compounds that can be condensed with phenolic compounds include, for example, 4,4'-bischloromethylbiphenyl, 4,4'-bischloromethylbiphenyl-2-carboxylic acid, 4,4'-bischloromethylbiphenyl-2,2'-dicarboxylic acid, 4,4'-bis(chloromethyl)-2-methylbiphenyl, 4,4'-bis(chloromethyl)-2,2'-dimethylbiphenyl, 4,4'-biphenyldimethanol, 4,4'-bis(methoxymethyl)biphenyl, etc. Other than these examples, those having various kinds of substituents or reactive groups may also be employed. Although the 4,4'-structures have been mentioned above as specific examples of the biphenyldiyl compound, the compound may be, for example, a compound having another substitution structure, such as a 2,2'-, 2,3'-, or 3,4'-structure. Among them, from the viewpoint of further elongation, 4,4'-substituted biphenyldiyl compounds are preferable. Any one of these biphenyldiyl compounds can be used alone or two or more thereof can be used in combination.

Meanwhile, the phenolic compound to be condensed with a biphenyldiyl compound is an aromatic compound having at least one phenolic hydroxyl group in one molecule thereof. Specific examples of the aromatic compound include various o-, m-, and p-isomers of alkylphenols typified by examples, such as phenol, cresol, ethylphenol, n-propylphenol, isobutylphenol, t-butylphenol, octylphenol, nonylphenol, xylenol, methylbutylphenol, and di-t-butylphenol; various o-, m-, and p-isomers of vinylphenols, alkylphenols, propenylphenol, and ethynylphenols; and substituted phenols, such as a cycloalkylphenol typified by cyclopentylphenol, cyclohexylphenol, and cyclohexylcresol; and phenylphenol. Additionally, specific examples of aromatic compounds having two or more phenolic hydroxyl groups in one molecule thereof include, for example, catechol, resorcinol, hydroquinone, pyrogallol, phloroglucinol, 1,2,4-trihydroxybenzene, etc. Any one of these phenols can be used alone or two or more thereof can be used in combination.

Hereinafter, a brief description will be given of the condensation reaction of the biphenyldiyl compounds and the phenolic compounds.

Resinification of a biphenyldiyl compound and a phenolic compound can be made by polymerizing the compounds through dehydration or dealcoholization. A catalyst may be used upon polymerization. Examples of acidic catalysts include hydrochloric acid, sulfuric acid, nitric acid, phosphoric acid, phosphorous acid, methanesulfonic acid, p-toluenesulfonic acid, dimethyl sulfate, diethyl sulfate, acetic acid, oxalic acid, 1-hydroxyethylidene-1,1'-diphosphonate, zinc acetate, boron trifluoride, a boron trifluoride-phenol complex, a boron trifluoride-ether complex, etc. On the other hand, examples of alkaline catalysts include lithium hydroxide, sodium hydroxide, potassium hydroxide, calcium hydroxide, barium hydroxide, sodium carbonate, triethylamine, pyridine, 4-N,N-dimethylaminopyridine, piperidine, piperazine, 1,4-diazabicyclo[2.2.2]octane, 1,8-diazabicyclo[5.4.0]-7-undecene, 1,5-diazabicyclo[4.3.0]-5-nonen, ammonia, hexamethylenetetramine, etc.

When performing a synthesis reaction of the biphenyldiyl-phenolic resin, an organic solvent can be used as needed. Specific examples of the organic solvent include bis(2-methoxyethyl)ether, methylcellosolve, ethylcellosolve, propylene glycol monomethylether, propylene glycol monomethyl ether acetate, diethylene glycol dimethyl ether, dipropylene glycol dimethyl ether, cyclohexanone, cyclopentanone, toluene, xylene, γ-butyrolactone, N-methyl-2-pyrrolidone, etc., although not limited thereto. An amount of the organic solvent to be used is usually 10 to 1000 parts by mass, and preferably 20 to 500 parts by mass, provided that a total mass of raw material(s) to be fed is 100 parts by mass. In addition, reaction temperature is usually 40 to 250° C., and more preferably 100 to 200° C. Furthermore, reaction time is usually 1 to 10 hours.

The biphenyldiyl-phenolic resin to be used in the first composition is preferably a phenolic resin comprising a repeating unit represented by the following formula (1):

{Chemical Formula 4}

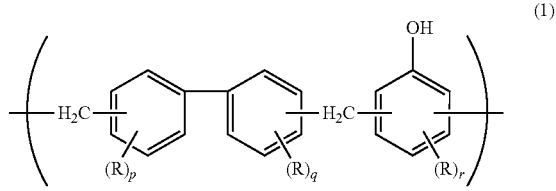

(in which R is a group selected from the group consisting of a halogen atom, a carboxyl group, a hydroxyl group, an aliphatic group having 1 to 10 carbon atoms, which may have an unsaturated bond, an alicyclic group having 3 to 10 carbon atoms, and an aromatic group having 6 to 20 carbon atoms; a hydrogen atom of each group may be additionally substituted with a halogen atom, a carboxyl group and/or a hydroxyl group; p and q are each independently an integer of 0 to 4; r is an integer of 0 to 3; and when p, q, or r is 2 or larger, each R may be the same as or different from the other).

The number of repeats of the repeating unit in formula (1) above is 2 to 100, but from the viewpoint of elongation, more preferably 8 to 80, and still more preferably 18 to 80.

In formula (1) above, from the viewpoint of further elongation, more preferably, a plurality of the R included in the biphenyldiyl structure are each independently fluorine, a methyl group, or a trifluoromethyl group, or p=q=0 (that is, unsubstituted). Preferably, the R included in the phenol structure is a hydroxyl group or r=0 (that is, unsubstituted) from the viewpoint of further elongation. In formula (1) above, preferably, the biphenyldiyl structure is linked at a 4,4'-position from the viewpoint of elongation.

The biphenyldiyl-phenolic resin used in the first composition is, more preferably, a phenolic resin comprising a repeating unit represented by the following formula (2):

[Chemical Formula 5]

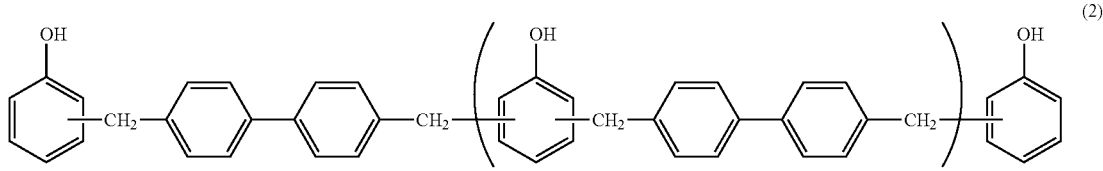

The number of repeats of the repeating unit in formula (2) above is 2 to 100, and from the viewpoint of elongation, more preferably 8 to 80, and still more preferably 18 to 80.

Specific examples of the one represented by formula (2) above include, for example, as a commercially available product, MEH-7851 series phenolic resins manufactured by Meiwa Plastic Industries, Ltd.

In the first aspect of the present invention, a weight average molecular weight of the biphenyldiyl-phenolic resin is 700 to 35,000, preferably 2,500 to 25,000, and more preferably 5,000 to 25,000. The weight average molecular weight of the resin is preferably 700 or more from the viewpoint of elongation, and preferably 35,000 or less from the viewpoint of the solubility of the composition in alkali.

In addition, as long as advantageous effects of the first aspect of the present invention are not affected, the photopolymer resin composition can be mixed with an alkaline aqueous solution-soluble resin other than phenolic resin (A). Specific examples of the alkaline aqueous solution-soluble resin include phenolic resins containing no biphenyldiyl structure, polymerization resins of phenols and unsaturated bond-containing compounds, polyhydroxystyrene-based resins, polyamide, polyimide, and derivatives, precursors or copolymers thereof, etc.

The phenolic resins containing no biphenyldiyl structure can be obtained by polymerizing a phenol or derivative thereof and an aldehyde compound, a ketone compound, a methylol compound, or an alkoxymethyl compound.

Examples of the phenol or derivative thereof include phenol, cresol, ethylphenol, propylphenol, butylphenol, amylphenol, benzylphenol, adamantanephenol, benzyloxyphenol, xylenol, catechol, resorcinol, ethyl resorcinol, hexylresorcinol, hydroquinone, pyrogallol, phloroglucinol, 1,2,4-trihydroxybenzene, pararosolic acid, biphenol, bisphenol A, bisphenol AF, bisphenol B, bisphenol F, bisphenol S, dihydroxydiphenylmethane, 1,1-bis(4-hydroxyphenyl)cyclohexane, 1,4-bis(3-hydroxyphenoxybenzene), 2,2-bis(4-hydroxy-3-methylphenyl)propane, α,α'-bis(4-hydroxyphenyl)-1,4-diisopropylbenzene 9,9-bis(4-hydroxy-3-methylphenyl)fluorene, 2,2-bis(3-cyclohexyl-4-hydroxyphenyl)propane, 2,2-bis(2-hydroxy-5-biphenylyl)propane, dihydroxybenzoic acid, etc.

Examples of the aldehyde compound include formaldehyde, paraformaldehyde, acetaldehyde, propionaldehyde, pivalaldehyde, butylaldehyde, pentanal, hexanal, trioxane, glyoxal, cyclohexylaldehyde, diphenylacetaldehyde, ethylbutylaldehyde, benzaldehyde, glyoxylic acid, 5-norbornene-2-carboxyaldehyde, malondialdehyde, succindialdehyde, glutaraldehyde, salicylaldehyde, naphthaldehyde, terephthalaldehyde, etc.

Examples of the ketone compound include acetone, methylethylketone, diethylketone, dipropylketone, dicyclohexylketone, dibenzylketone, cyclopentanone, cyclohexanone, bicyclohexanone, cyclohexanedione, 3-butyn-2-one, 2-norbornanone, adamantanone, 2,2-bis(4-oxocyclohexyl)propane, etc.

Examples of the methylol compound include 1,3-bis(hydroxymethyl)urea, ribitol, arabitol, allitol, 2,2-bis(hydroxymethyl)butyric acid, 2-benzyloxy-1,3-propanediol, cyclohexanedimethanol, 2,2-dimethyl-1,3-propanediol, 2,2-diethyl-1,3-propanediol, monoacetin, 2-methyl-2-nitro-1,3-propanediol, 5-norbornene-2,2-dimethanol, 5-norbornene-2,3-dimethanol, pentaerythritol, 2-phenyl-1,3-propanediol, trimethylolethane, trimethylolpropane, 3,6-bis(hydroxymethyl)durene, 2,6-bis(hydroxymethyl)-p-cresol, 2,3-bis(hydroxymethyl)naphthalene, 2,2'-bis(hydroxymethyl)diphenylether, 1,8-bis(hydroxymethyl)anthracene, 2,6-bis(hydroxymethyl)-1,4-dimethoxybenzene, 1,4-benzenedimethanol, 2-nitro-p-xylylene glycol, 1,3-benzenedimethanol, etc.

Examples of the alkoxymethyl compound include 1,4-bis(methoxymethyl)benzene, 1,3,4,6-tetrakis(methoxymethyl)glycoluril, 2,4,6-tris[bis(methoxymethyl)amino]-1,3,5-triazine, etc.

The polymerization resins of phenols and unsaturated bond-containing compounds can be obtained by polymerizing a phenol or derivative thereof and an unsaturated bond-containing compound.

Examples of the phenol or derivative thereof that can be used may be the same as those mentioned above, and examples of the unsaturated bond-containing compound include butadiene, pentadiene, 1,3-butanediol-dimethacrylate, cyclohexadiene, cyclopentadiene, allyl ether, allyl sulfide, diallyl adipate, dicyclopentadiene, 1-hydroxydicyclopentadiene, 1-methylcyclopentadiene, 2,5-norbornadiene, tetrahydroindene, 5-ethylidene-2-norbornene, 5-vinyl-2-norbornene, triallyl cyanurate, etc.

The polyamide, the polyimide and a precursor thereof, or a copolymer of these resins can be synthesized by known methods. For example, the polyamide can be synthesized by condensation reaction between dicarboxylic acid or an acid chloride derivative thereof and diamine. The polyimide and a precursor thereof can be synthesized by condensation reaction between a tetracarboxylic acid dianhydride and diamine. From the viewpoint of ensuring solubility in alkaline aqueous solution, preferably, at least one phenolic hydroxyl group is included in a structural formula of diamine used for synthesis of the polyamide or the polyimide and a precursor thereof. Specific examples of these diamines include 3,3'-diamino-4,4'-dihydroxybiphenyl, 4,4'-diamino-3,3'-dihydroxybiphenyl, 3,3'-diamino-4,4'-dihydroxydiphenylsulfone, 4,4'-diamino-3,3'-dihydroxydiphenylsulfone, bis-(3-amino-4-hydroxyphenyl)methane, 2,2-bis-(3-amino-4-hydroxyphenyl)propane, 2,2'-bis-(3-amino-4-hydroxyphenyl)hexafluoropropane, 2,2'-bis-(4-amino-3-hydroxyphenyl)hexafluoropropane, bis-(4-amino-3-hydroxyphenyl)methane, 2,2'-bis-(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenylether, 3,3'-diamino-4,4'-dihydroxydiphenylether, 1,4-diamino-2,5-dihydroxybenzene, 1,3-diamino-2,4-dihydroxybenzene, 1,3-diamino-4,6-dihydroxybenzene, etc. These diamine compounds may be used alone or in combination.

When using the biphenyldiyl-phenolic resin in combination with other alkaline aqueous solution-soluble resin(s), a content by percentage of the biphenyldiyl-phenolic resin is preferably 50% by mass or more, and more preferably 60% by mass or more, from the viewpoint of elongation.

An elongation obtained when the photopolymer composition is made into a cured product is preferably 8% or more, and more preferably 10% or more, from the viewpoint of the reliability of a semiconductor element or a semiconductor component using the semiconductor element.

[(B) Photo Acid-Generating Agent]

The first composition is not specifically limited as long as it is a composition that can form a resin pattern in response to irradiation with light, such as UV light, electron beam, or X ray, and it may be either negative-type or positive-type photosensitive composition.

When the first composition is used as a negative-type photosensitive composition, photo acid-generating agent (B) generates acid in response to irradiation with light, and the generated acid can cause a crosslinking reaction between phenolic resin (A) and other ingredient(s) of the first composition, as described below. Such compounds include, for example, the following:

(i) Trichloromethyl-S-Triazines

Tris(2,4,6-trichloromethyl)-s-triazine, 2-phenyl-bis(4,6-trichloromethyl)-s-triazine, 2-(3-chlorophenyl)-bis(4,6- trichloromethyl)-s-triazine, 2-(2-chlorophenyl)-bis(4,6-trichloromethyl)-s-triazine, 2-(4-methoxyphenyl)-bis(4,6-trichloromethyl)-s-triazine, 2-(3-methoxyphenyl)-bis(4,6-trichloromethyl)-s-triazine, 2-(2-methoxyphenyl)-bis(4,6-trichloromethyl)-s-triazine, 2-(4-methylthiophenyl)-bis(4,6-trichloromethyl)-s-triazine, 2-(3-methylthiophenyl)bis(4,6-trichloromethyl-s-triazine, 2-(2-methylthiophenyl)-bis(4,6-trichloromethyl)-s-triazine, 2-(4-methoxynaphtyl)-bis(4,6-trichloromethyl)-s-triazine, 2-(3-methoxynaphtyl)-bis(4,6-trichloromethyl)-s-triazine, 2-(2-methoxynaphtyl)-bis(4,6-trichloromethyl)-s-triazine, 2-(3,4,5-trimethoxy-β-styryl)-bis(4,6-trichloromethyl)-s-triazine, 2-(4-methylthio-β-styryl)-bis(4,6-trichloromethyl)-s-triazine, 2-(3-methylthio-β-styryl)-bis(4,6-trichloromethyl)-s-triazine, 2-(2-methylthio-β-styryl)-bis(4,6-trichloromethyl)-s-triazine, etc.;

(ii) Diaryliodoniums

Diphenyliodonium tetrafluoroborate, diphenyliodonium tetrafluorophosphate, diphenyliodonium tetrafluoroarsenate, diphenyliodonium trifluoromethanesulfonate, diphenyliodonium trifluoroacetate, diphenyliodonium-p-toluenesulfonate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethanesulfonate, 4-methoxyphenylphenyliodonium trifluoroacetate, 4-methoxyphenylphenyliodonium-p-toluenesulfonate, bis(4-tert-butylphenyl)iodonium tetrafluoroborate, bis(4-tert-butylphenyl)iodonium hexafluoroarsenate, bis(4-tert-butylphenyl)iodonium trifluoromethanesulfonate, bis(4-tert-butylphenyl)iodonium trifluoroacetate, bis(4-tert-butylphenyl)iodonium-p-toluenesulfonate, etc.;

(iii) Triarylsulfonium Salts

Triphenylsulfonium tetrafluoroborate, triphenylsulfonium hexafluorophosphonate, triphenylsulfonium hexafluoroarsenate, triphenylsulfonium methanesulfonate, triphenylsulfonium trifluoroacetate, triphenylsulfonium-p-toluene sulfonate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium methanesulfonate, 4-methoxyphenyldiphenylsulfonium trifluoroacetate, 4-methoxyphenyldiphenylsulfonium-p-toluene sulfonate, 4-phenylthiophenyldiphenyl tetrafluoroborate, 4-phenylthiophenyldiphenyl hexafluorophosphonate, 4-phenylthiophenyldiphenyl hexafluoroarsenate, 4-phenylthiophenyldiphenyl trifluoromethanesulfonate, 4-phenylthiophenyldiphenyl trifluoroacetate, 4-phenylthiophenyldiphenyl-p-toluene sulfonate, etc.

Among these compounds, suitable trichloromethyl-s-triazines include 2-(3-chlorophenyl)-bis(4,6-trichloromethyl)-s-triazine, 2-(4-chlorophenyl)-bis(4,6-trichloromethyl)-s-triazine, 2-(4-methylthiophenyl)-bis(4,6-trichloromethyl)-s-triazine, 2-(4-methoxy-β-styryl)-bis(4,6-trichloromethyl)-s-triazine, 2-(4-methoxynaphtyl)-bis(4,6-trichloromethyl)-s-triazine, etc., suitable diiaryliodonium salts include diphenyliodonium trifluoroacetate, diphenyliodonium trifluoromethanesulfonate, 4-methoxyphenylphenyliodonium trifluoromethanesulfonate, 4-methoxyphenylphenyliodonium trifluoroacetate, etc., and suitable triarylsulfonium salts include triphenylsulfonium methanesulfonate, triphenylsulfonium trifluoroacetate, 4-methoxyphenyldiphenylsulfonium methanesulfonate, 4-methoxyphenyldiphenylsulfonium trifluoroacetate, 4-phenylthiophenyldiphenyl trifluoromethanesulfonate, 4-phenylthiophenyldiphenyl trifluoroacetate, etc.

Other than these, compounds mentioned below may also be used as photo acid-generating agent (B):

(1) Diazoketone Compounds

Diazoketone compounds include, for example, a 1,3-diketo-2-diazo compound, a diazobenzoquinone compound, a diazonaphthoquinone compound, etc. Specific examples thereof include 1,2-naphthoquinonediazide-4-sulfonate compounds of phenols.

(2) Sulfone Compounds

Sulfone compounds include, for example, β-ketosulfone compounds, β-sulfonylsulfone compounds, and α-diazo compounds of these compounds. Specific examples of sulfone compounds include 4-trisphenacylsulfone, mesitylphenacylsulfone, bis(phenacylsulfonyl)methane, etc.

(3) Sulfonic Acid Compounds

Sulfonic acid compounds include, for example, alkyl sulfonates, haloalkyl sulfonates, aryl sulfonates, iminosulfonates, etc. Specific examples of preferable sulfonic acid compounds include benzointocylate, pyrogallol tristrifluoromethanesulfonate, o-nitrobenzyl trifluoromethanesulfonate, o-nitrobenzyl-p-toluenesulfonate, etc.

(4) Sulfonimide Compounds

Sulfonimide compounds include, for example, N-(trifluoromethylsulfonyloxy)succinimide, N-((trifluoromethylsulfonyloxy)phthalimide, N-(trifluoromethylsulfonyloxy)diphenylmaleimide, N-(trifluoromethylsulfonyloxy)bicyclo-[2.2.1]hepto-5-ene-2,3-dicarboximide, N-(trifluoromethylsulfonyloxy)naphtylimide, etc.

(5) Oxime Ester Compounds

Specific examples of oxime ester compounds include 2-[2-(4-methylphenylsulfonyloxyimino)]-2,3-dihydrothiophen-3-ylidene]-2-(2-methylphenyl)acetonitrile (trade name "IRGACURE PAG 121" manufactured by Ciba Specialty Chemicals Inc.), [2-(propylsulfonyloxyimino)-2,3-dihydrothiophen-3-ylidene]-2-(2-methylphenyl)acetonitrile (trade name "IRGACURE PAG 103" manufactured by Ciba Specialty Chemicals Inc.), [2-(n-octanesulfonyloxyimino)-2,3-dihydrothiophen-3-ylidene]-2-(2-methylphenyl)acetonitrile (trade name "IRGACURE PAG 108" manufactured by Ciba Specialty Chemicals Inc.), α-(n-octanesulfonyloxyimino)-4-methoxybenzylcyanide (trade name "CGI 725" manufactured by Ciba Specialty Chemicals Inc.), etc.

(6) Diazomethane Compounds

Specific examples of diazomethane compounds include bis(trifluoromethylsulfonyl)diazomethane, bis(cyclohexylsulfonyl)diazomethane, bis(phenylsulfonyl)diazomethane, etc.

From the viewpoint of sensitivity, above all, the (5) oxime ester compounds are particularly preferable.

In the first composition, an amount of a compound that generates acid by irradiation of a ray, which is used as ingredient (B), is 1 to 30 parts by mass with respect to 100 parts by mass of the biphenyldiyl-phenolic resin used as ingredient (A) in the first composition. When the amount thereof added is 1 part by mass or more, the amount of acid generated by the irradiation of a ray is sufficient, improving sensitivity. When the amount thereof added is 30 parts by mass or less, post-curing mechanical properties are excellent.

The first composition can also be used as a positive-type photosensitive composition. In this case, preferably, photo acid-generating agent (B) includes a naphthoquinonediazide derivative. Examples of the naphthoquinonediazide derivative include compounds having a 1,2-benzoquinonediazide structure or 1,2-naphthoquinonediazide structure. These compounds are, for example, known by U.S. Pat. No. 2,772,972, U.S. Pat. No. 2,797,213, U.S. Pat. No. 3,669,658, and the like. The naphthoquinonediazide derivative is at least one compound (hereinafter also referred to as "NQD compound") selected from the group consisting of 1,2-naphthoquinonediazide-4-sulfonates and 1,2-naphthoquinonediazide-5-sulfonates of polyhydroxy compounds having a specific structure shown in detail below.

The NQD compound is obtainable according to a usual method as follows: a naphthoquinonediazide sulfonic acid compound is reacted with chlorosulfuric acid or thionyl chloride to obtain sulfonyl chloride, and condensation reaction is performed between the obtained naphthoquinonediazide-sulfonyl chloride and a polyhydroxy compound to obtain an NQD compound. For example, the NQD compound can be obtained by reacting predetermined amounts of a polyhydroxy compound and 1,2-naphthoquinonediazide-5-sulfonylchloride or 1,2-naphthoquinonediazide-4-sulfonylchloride in a solvent such as dioxane, acetone, or tetrahydrofuran in the presence of a basic catalyst such as triethylamine to perform esterification, and then washing with water and drying the obtained product.

From the viewpoint of cured film physical properties such as sensitivity and elongation, preferable NQD compounds include, for example, the following:

[Chemical Formula 6]

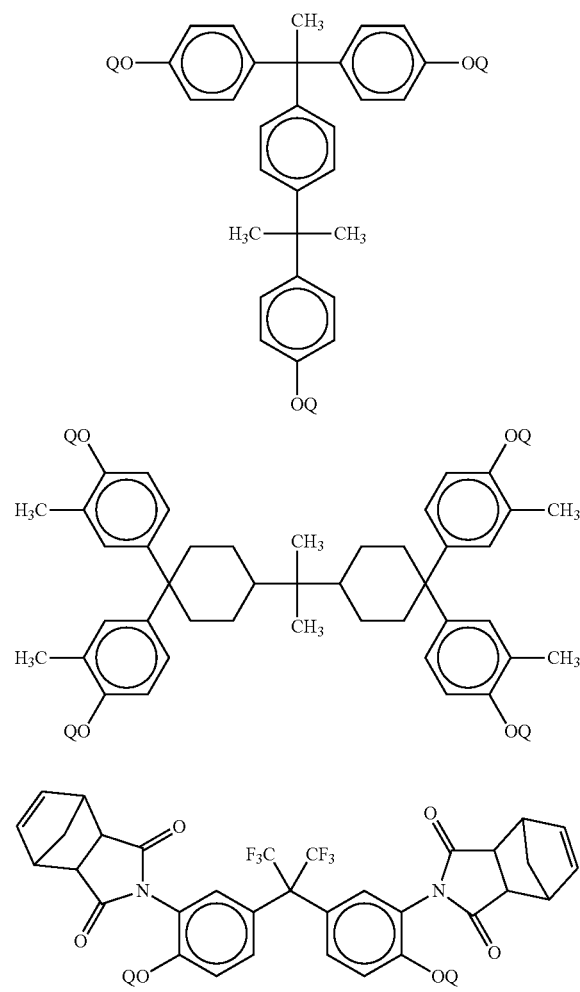
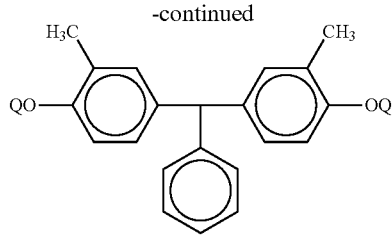

(in which, Q is a hydrogen atom or a naphthoquinonediazide sulfonate group represented by the following formula:

[Chemical Formula 7]

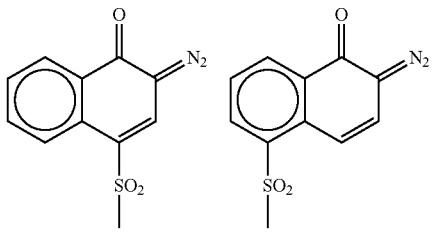

and all Qs are not simultaneously hydrogen atoms).

In addition, as the NQD compound, a naphthoquinonediazide sulfonyl ester compound having both a 4-naphthoquinonediazide sulfonyl group and a 5-naphthoquinonediazide sulfonyl group in the same molecule thereof, or a mixture of a 4-naphthoquinonediazide sulfonyl ester compound and a 5-naphthoquinonediazide sulfonyl ester compound may be used.

In the first composition, an amount of the naphthoquinonediazide derivative used as ingredient (B) is 1 to 30 parts by mass, and preferably 1 to 20 parts by mass, with respect to 100 parts by mass of biphenyldiyl-phenolic resin (A) in the first composition. When the amount of the derivative added is 1 part by mass or more, the amount of acid generated by the irradiation of a radiation ray is sufficient, improving sensitivity and obtaining good patternability. When the amount thereof added is 30 parts by mass or less, mechanical properties of the cured film are excellent and there is little development residue (scum) on the exposed area.

Any one of the naphthoquinonediazide derivatives may be used alone or two or more thereof may be used in combination.

[(C) Compound that can be Reacected with Ingredient (A) by Acid Generated from Photo Acid-Generating Agent (B) or Heat]

By adding, to ingredient (A) and ingredient (B), a compound (hereinafter also referred to as simply "crosslinking agent") that can be reacted with the biphenyldiyl-phenolic resin as ingredient (A) by means of action of acid generated from photo acid-generating agent (B) or of heat, film performances, such as mechanical properties, heat resistance, and chemical resistance, can be enhanced upon thermal curing of a coated film. In order to enhance the film performances sufficiently, the crosslinking agent is preferably a compound having at least two groups selected from the group consisting of an epoxy group, an oxetane group, a —N—($CH_2$—OR') group (in which R' is hydrogen or an alkyl group having 1 to 4 carbon atoms), and a —C—($CH_2$—OR') group (in which R' is hydrogen or an alkyl group having 1 to 4 carbon atoms).

The crosslinking agent having at least two N—(CH$_2$—OR') groups (in which R' is hydrogen or an alkyl group having 1 to 4 carbon atoms) in a molecular structure thereof include, for example, melamine resins and urea resins, both of which are substituted at the N positions by methylol or alkoxymethyl. Specific examples of such resins include melamine resin, benzoguanamine resin, glycol uryl resin, hydroxy ethylene urea resin, urea resin, glycol urea resin, alkoxymethylated melamine resin, alkoxymethylated benzoguanamine resin, alkoxymethylated glycol uryl resin, and alkoxymethylated urea resin. Among them, alkoxymethylated melamine resin, alkoxymethylated benzoguanamine resin, alkoxymethylated glycol uryl resin, and alkoxymethylated urea resin are obtained by replacing methylol groups of known methylololated melamine resins, methylololated benzoguanamine resins, and methylololated urea resins with alkoxymethyl groups.

The types of the alkoxymethyl groups include, for example, a methoxymethyl group, an ethoxymethyl group, a propoxymethyl group, a butoxymethyl group, etc. Practically, commercially available products such as CYMEL 300, 301, 303, 370, 325, 327, 701, 266, 267, 238, 1141, 272, 202, 1156, 1158, 1123, 1170 or 1174 and UFR 65 or 300 (manufactured by Mitsui Cytec, Co. Ltd.), NIKALAC MX-270, -280 or -290, NIKALAC MS-11 and NIKALAC MW-30,-100, -300, -390 or -750 (manufactured by Sanwa Chemical Co., Ltd.), etc., can be preferably used. These compounds may be used alone or in combination.

The crosslinking agents having at least two C—(CH$_2$—OR') groups (in which R' is hydrogen or an alkyl group) in the molecular structure thereof include, for example, 1,4-bis (methoxymethyl)benzene, 4,4'-biphenyldimethanol, 4,4'-bis (methoxymethyl)biphenyl, commercially available 26DMPC, 46DMOC, DM-BIPC-F, DM-BIOC-F, and TM-BIP-A (manufactured by Asahi Organic Chemicals Industry Co., Ltd.), DML-MBPC, DML-MBOC, DML-OCHP, DML-PC, DML-PCHP, DML-PTBP, DML-34×, DML-EP, DML-POP, DML-OC, dimethylol-Bis-C, dimethylol-BisOC-P, DML-BisOC-Z, DML-BisOCHP-Z, DML-PFP, DML-PSBP, DML-MB25, DML-MTrisPC, DML-Bis25X-34XL, DML-Bis25X-PCHP, 2,6-dimethoxymethyl-4-t-butylphenol, 2,6-dimethoxymethyl-p-cresol, 2,6-diacetoxymethyl-p-cresol, TriML-P, TriML-35XL, TriML-TrisCR-HAP, HML-TPPHBA, HML-TPHAP, HMOM-TPPHBA, and HMOM-TPHAP (manufactured by Honshu Chemical Industry Co. Ltd.), etc. These compounds may be used alone or in combination.

The crosslinking agents having at least two epoxy groups or oxetane groups in molecular structure thereof include, for example, epoxy compounds, such as 1,1,2,2-tetra(p-hydroxyphenyl)ethane tetraglycidyl ether, glycerol triglycidyl ether, ortho-sec-butylphenyl glycidyl ether, 1,6-bis(2,3-epoxypropoxy)naphthalene, diglycerol polyglycidyl ether, polyethylene glycol glycidyl ether, triglycidyl isocyanurate, DENACOL EX-201, EX-313, EX-314, EX-321, EX-411, EX-511, EX-512, EX-612, EX-614, EX-614B, EX-731, EX-810, EX-911 and EM-150 (trade names, manufactured by Nagase ChemteX Corporation), and oxetane compounds, such as xylylene bisoxetane and 3-ethyl-3{[(3-ethyloxetane-yl) methoxy]methyl}oxetane. These compounds may be used alone or in combination.

An amount of the crosslinking agent(s) added is 1 to 60 parts by mass, and preferably 3 to 50 parts by mass, with respect to 100 parts by mass of biphenyldiyl-phenolic resin (A). When the amount thereof added is 1 part by mass or more, crosslinking sufficiently proceeds, so that an enhancement effect on the film physical properties can be obtained. When the amount thereof added is 60 parts by mass or less, the elongation is maintained.

The crosslinking agent(s) that can be used in the first composition include, besides those mentioned above, for example, oxazoline compounds, such as 2,2'-bis(2-oxazoline), 2,2'-isopropylidenebis(4-phenyl-2-oxazoline), 1,3-bis (4,5-dihydro-2-oxazolyl)benzene, 1,4-bis(4.5-dihydro-2-oxazolyl)benzene, EPOCROS K-2010E, K-2020E, K-2030E, WS-500, WS-700 and RPS-1005 (trade names, manufactured by Nippon Shokubai Co., Ltd.); carbodiimide compounds, such as CARBODILITE SV-02, V-01, V-02, V-03, V-04, V-05, V-07, V-09, E-01, E-02 and LA-1 (trade names, manufactured by Nisshinbo Chemical Inc.); aldehydes and aldehyde-modified products, such as formaldehyde, glutaraldehyde, hexamethylene tetramine, trioxane, glyoxal, malondialdehyde, and succindialdehyde; isocyanate-based crosslinking agents, such as 4,4'-diphenylmethane diisocyanate, tolylene diisocyanate, 1,3-phenylenebismethylene diisocyanate, dicyclohexylmethane-4,4'-diisocyanate, isophorone diisocyanate, hexamethylene diisocyanate, TAKENATE 500 and 600, COSMONATE NBDI and ND (trade names, manufactured by Mitsui Chemicals Co., Ltd.), DURANATE 17B-60PX, TPA-B80E, MF-B60X, MF-K60X, and E402-B80T (trade names, manufactured by Asahi Kasei Chemicals Corporation); metal chelating agents, such as acetylacetone aluminium(III) salt, acetylacetone titanium(IV) salt, acetylacetone chromium(III) salt, acetylacetone magnesium(II) salt, acetylacetone nickel(II) salt, trifluoroacetylacetone aluminium(III) salt, trifluoroacetylacetone titanium(IV) salt, trifluoroacetylacetone chromium(III) salt, trifluoroacetylacetone magnesium(II) salt, and trifluoroacetylacetone nickel(II) salt; unsaturated bond-containing compounds, such as vinyl acetate, trimethylolpropane trimethacrylate, triallyl 1,3,5-benzenetricarboxylate, triallyl trimellitate, tetra-allyl pyromellitate, pentaerythritol pentaacrylate, dipentaerythritol pentaacrylate, trimethylolpropane triacrylate, ditrimethylolpropane tetraacrylate, and BANI-M and BANI-X (trade names, manufactured by Maruzen Petrochemical Co., Ltd).

(D) Thermal Base-Generating Agent

From the viewpoint of improving physical properties of a cured film, the first composition can further comprise (D) a thermal base-generating agent. Particularly, when a crosslinking agent as ingredient (C) contains an epoxy group or an oxetane group, a crosslinking reaction between the crosslinking agent as ingredient (C) and the resin as ingredient (A) is accelerated upon thermal curing, so that the film properties of the first composition can be further enhanced. Therefore, the first composition further preferably comprises the thermal base-generating agent (D). A thermal decomposition temperature of the thermal base-generating agent to be used in the first composition is 50° C. or higher, preferably 70° C. or higher, and more preferably 90° C. or higher. Specific examples of the thermal base-generating agent (D) include compounds represented by the following formulae:

[Chemical Formula 8]

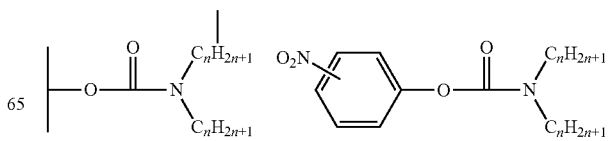

-continued

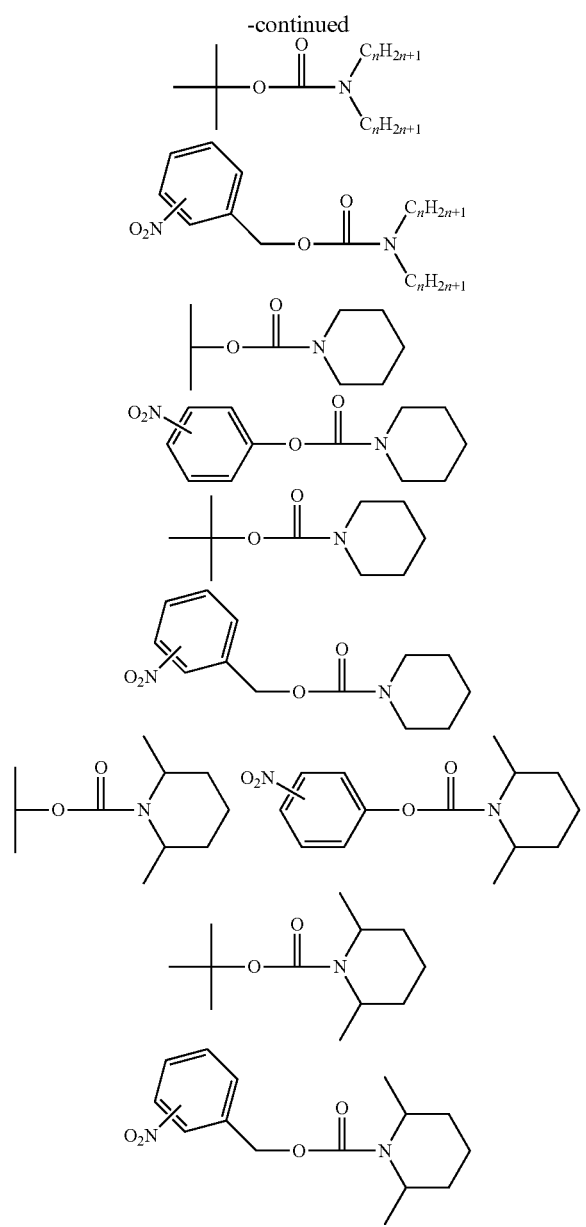

(in which n is an integer of 1 to 20).

[Chemical Formula 9]

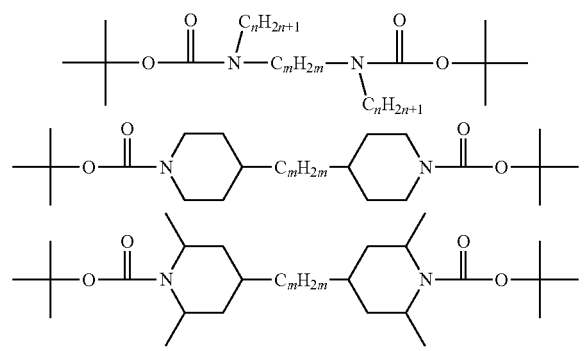

(in which m and n are each independently an integer of 1 to 20).

Preferably, thermal base-generating agent (D) used in the first composition is represented by the following formulae:

[Chemical Formula 10]

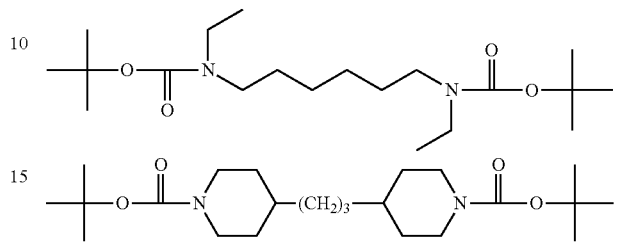

When added to the first composition, an amount of thermal base-generating agent (D) added is preferably 0.1 to 40 parts by mass, and more preferably 0.5 to 30 parts by mass, with respect to 100 parts by mass of biphenyldiyl-phenolic resin (A). From the viewpoint where crosslinking promotion proceeds sufficiently to obtain an enhancement effect on the film physical properties, the amount thereof added is preferably 0.1 parts by mass or more, and from the viewpoint of the elongation, preferably 40 parts by mass or less.

(E) Solvent

Examples of a solvent to be used in the first composition include amides, sulfoxides, ureas, ketones, esters, lactones, ethers, halogenated hydrocarbons, hydrocarbons, etc. For example, solvents that may be used include N-methyl-2-pyrrolidone, N,N-dimethylacetoamide, N,N-dimethylformamide, dimethylsulfoxide, tetramethylurea, acetone, methylethylketone, methyl isobutyl ketone, cyclopentanone, cyclohexanone, methyl acetate, ethyl acetate, butyl acetate, diethyl oxalate, ethyl lactate, methyl lactate, butyl lactate, γ-butyrolactone, propylene glycol monomethyl ether acetate, propylene glycol monomethyl ether, benzyl alcohol, phenyl glycol, tetrahydrofurfuryl alcohol, ethylene glycol dimethyl ether, diethylene glycol dimethyl ether, tetrahydrofuran, morpholine, dichloromethane, 1,2-dichloroethane, 1,4-dichlorobutane, chlorobenzene, o-dichlorobenzene, anisole, hexane, heptane, benzene, toluene, xylene, mesitylene, etc.

An amount of the solvent in the first composition is in a range of 100 to 1000 parts by mass, preferably 120 to 700 parts by mass, and more preferably 150 to 500 parts by mass, with respect to 100 parts by mass of biphenyldiyl-phenolic resin (A).

(F) Other Ingredients

The first composition may also include, as needed, a dye, a surfactant, an adhesion aid for increasing adhesion to a substrate, a dissolution accelerator, a crosslinking accelerator, and/or the like.

The dye includes, for example, methyl violet, crystal violet, malachite green, etc. An amount of the dye added is preferably 0.1 to 30 parts by mass with respect to 100 parts by mass of biphenyldiyl-phenolic resin (A).

For example, in addition to nonionic surfactants composed of polyglycols, such as, polypropylene glycol and polyoxyethylene lauryl ether, or derivatives thereof, the surfactant includes, for example, fluorine-based surfactants, such as, FLUORAD (registered trade mark, trade name, manufactured by Sumitomo 3M Limited), MEGAFAC (registered trade mark, trade name, manufactured by Dainippon Ink & Chemicals, Inc.), and LUMIFLON (registered trade mark, trade name, manufactured by Asahi Glass Co., Ltd.), and for example, organic siloxane surfactants, such as, KP 341 (trade name, manufactured by Shin-Etsu Chemical Co., Ltd.), DBE (trade name, manufactured by Chisso Corporation), and GLANOL (trade name, manufactured by Kyoeisha Chemical Co., Ltd).

In the case of using a surfactant, an amount of the surfactant added is preferably 0.01 to 10 parts by mass with respect to 100 parts by mass of biphenyldiyl-phenolic resin (A).

The adhesion aid includes, for example, alkyl imidazoline, butyric acid, alkyl acid, polyhydroxystyrene, polyvinylmethylether, t-butyl novolac, epoxy silane, epoxy polymers, etc., as well as various types of alkoxy silanes.

Preferable examples of alkoxy silanes include tetraalkoxy silane, bis(trialkoxysilyl)methane, bis(trialkoxysilyl)ethane, bis(trialkoxysilyl)ethylene, bis(trialkoxysilyl)hexane, bis(trialkoxysilyl)octane, bis(trialkoxysilyl)octadiene, bis[3-(trialkoxysilyl)propyl]disulfide, N-phenyl-3-aminopropyl trialkoxysilane, 3-mercaptopropyl trialkoxysilane, 2-(trialkoxysilylethyl)pyridine, 3-methacryloxypropyl trialkoxysilane, 3-methacryloxypropyl dialkoxyalkylsilane, vinyltrialkoxysilane, 3-ureidopropyl-trialkoxysilane, 3-isocyanatepropyl-trialkoxysilane, 3-(trialkoxysilyl)propyl succinic anhydride, N-(3-trialkoxysilylpropyl)-4,5-dihydroimidazole, 2-(3,4-epoxycyclohexyl)ethyl trialkoxysilane, 3-glycidoxypropyl trialkoxysilane, 3-glycidoxypropyl dialkoxyalkylsilane, reaction products of 3-aminopropyl trialkoxysilane and 3-aminopropyl dialkoxyalkylsilane with acid anhydride or acid dianhydride, 3-aminopropyl trialkoxysilane or 3-aminopropyl dialkoxyalkylsilane in which amino groups have been substituted with urethane groups or urea groups, etc. In addition, alkyl groups in the above-mentioned compounds include methyl, ethyl, propyl, butyl groups, etc.; the acid anhydride includes maleic anhydride, phthalic anhydride, 5-norbornene-2,3-dicarboxylic acid anhydride, etc.; the acid dianhydride includes pyromellitic dianhydride, 3,3',4,4'-benzophenone tetracarboxylic acid dianhydride, 4,4'-oxydiphthalic dianhydride, etc.; the urethane group includes a t-butoxycarbonylamino group, etc.; and the urea group includes a phenylaminocarbonylamino group, etc.

In the case of using an adhesion aid, an amount of the adhesion aid added is preferably 0.1 to 30 parts by mass with respect to 100 parts by mass of biphenyldiyl-phenolic resin (A).

The dissolution accelerator is preferably a compound having a hydroxyl group or a carboxyl group. Examples of compounds having a hydroxyl group include linear phenolic compounds, such as ballasting agents used in the above-mentioned naphthoquinoneazide compounds, p-cumylphenols, bisphenols, resorcinols, MtrisPC, and MtetraPC; nonlinear phenolic compounds, such as TrisP-HAP, TrisP-PHBA, and TrisP-PA (all manufactured by Honshu Chemical Industry Co. Ltd.); 2 to 5 phenolic substituents of diphenylmethane, 1 to 5 phenolic substitutents of 3,3'-diphenylpropane, a 1:2 reaction product of 2,2-bis-(3-amino-4-hydroxyphenyl)hexafluoropropane and 5-norbornene-2,3-dicarboxylic acid anhydride, a 1:2 reaction product of bis-(3-amino-4-hydroxyphenyl)sulfone and 1,2-cyclohexyldicarboxylic acid anhydride, N-hydroxy succinimide, N-hydroxyphthalic imide, N-hydroxy 5-norbornene-2,3-dicarboxylic acid imide, etc.

Examples of compounds having a carboxyl group include 3-phenyllactic acid, 4-hydroxyphenyllactic acid, 4-hydroxymandelic acid, 3,4-dihydroxymandelic acid, 4-hydroxy-3-methoxymandelic acid, 2-methoxy-2-(1-naphthyl)propionic acid, mandelic acid, atrolactic acid, acetylmandelic acid, α-methoxyphenylacetic acid, etc.

In the case of using a dissolution accelerator, an amount of the dissolution accelerator added is preferably 0.1 to 50 parts by mass with respect to 100 parts by mass of biphenyldiyl-phenolic resin (A).

The crosslinking accelerator is preferably a compound that generates radicals by means of heat or light. The compound includes alkylphenones, such as IRGACURE 651, 184, 2959, 127, 907, 369 and 379 (trade names, manufactured by BASF Japan Inc.), acylphosphine oxides, such as IRGACURE 819 (trade name, manufactured by BASF Japan Inc.), titanocenes, such as IRGACURE 784 (trade name, manufactured by BASF Japan Inc.), oxime esters, such as IRGACURE OXE 01 and 02 (trade names, manufactured by BASF Japan Inc.), etc.

<Method for Forming Cured Relief Pattern>

Hereinafter, an example of a method for forming a cured relief pattern on a substrate will be explained, in the case of using the first composition to which a photosensitizer is added.

First, the first composition is applied onto an appropriate support, for example, a silicon wafer, a ceramic, an aluminum substrate, a copper substrate, or the like. At that time, to ensure water-resistant adhesion between a pattern to be formed and the support, an adhesion aid, such as a silane coupling agent may be previously applied on the support. The first composition may be applied by means of spin coating using a spinner, spray coating using a spray coater, dipping, printing, roll coating, or the like. Next, after the coated film is dried by prebaking at 80 to 140° C., the film is subjected to a chemical ray by means of an exposure apparatus, such as a contact aligner, a mirror projection, or a stepper. The chemical ray that may be used include X ray, electron beam, UV ray, visible light, etc., and preferably has a wavelength of 200 to 500 nm. In terms of pattern resolution and handling, the light source wavelength is preferably a wavelength of g-ray, h-ray, or i-ray of a mercury lamp, and those rays may be used alone or in combination. As the exposure apparatus, a contact aligner, a mirror projection, and a stepper are particularly preferable.

Next, development will be carried out. The development method can be selected from dipping, paddling, spin spraying, and the like. Developers that may be used include aqueous solutions of inorganic alkalines, such as sodium hydroxide, sodium carbonate, sodium silicate, and an ammonia solution; organic amines, such as ethylamine, diethylamine, triethylamine, and triethanolamine; and/or quaternary ammonium salts, such as tetramethylammonium hydroxide and tetrabutylammonium hydroxide, as well as, if needed, aqueous solutions thereof prepared by adding an appropriate amount of a water-soluble organic solvent, such as methanol or ethanol or a surfactant. Above all, an aqueous solution of tetramethylammonium hydroxide is preferable, and the concentration thereof is 0.5 to 10% by weight, and preferably 1.0 to 5% by weight.

After development, cleaning is carried out with a rinsing liquid to remove the developer, thereby obtaining a pattern film. As the rinsing liquid, distilled water, methanol, ethanol, isopropanol, or the like may be used alone or in combination.

Finally, the relief pattern obtained in this manner is heated, whereby a cured relief pattern can be obtained. The heating temperature is preferably 150° C. or higher.

In an ordinary method for forming a cured relief pattern by using a polyimide or polybenzoxazole precursor composition, it is necessary to convert the precursor composition to polyimide, polybenzoxazole, or the like by heating it to 300° C. or higher, so as to allow dehydrative cyclization reaction to proceed. However, in the present method, it is unnecessary to do that, so that the composition of the present invention can be suitably used even for semiconductor devices and the like easily affected by heat. To give an example, the composition of the invention is suitably used for semiconductor devices having an insulating layer made of a high dielectric constant material or a ferroelectric material having a restricted processing temperature, for example, an oxide of a metal having high melting point, such as titanium, tantalum, or hafnium.

In the case of a semiconductor device without any such a restriction on heat resistance, it is obvious that even in the present method, heating to 300 to 400° C. may be carried out. As an apparatus for performing such a heating treatment, a hot plate, an oven, or a thermal oven allowing the setting of a temperature program may be used. As an atmospheric gas for heating treatment, air or an inert gas, such as nitrogen or argon may be used. In addition, when heat treatment needs to be performed at lower temperature, heating may be carried out under reduced pressure by using a vacuum pump or the like.

<Semiconductor Device>

A semiconductor device according to the first aspect of the present invention can be manufactured by using the above-described cured relief pattern as a surface protective film, an interlayer insulating film, an insulating film for rewiring, a protective film for a flip-chip device, and a protective film of a device having a bump structure and also by combining with steps of a known method for manufacturing a semiconductor device.

<Semiconductor Element Surface Protective Film or Interlayer Insulating Film>

According to the first aspect of the present invention, using the above-described first composition allows the manufacturing of a semiconductor element surface protective film or an interlayer insulating film. Additionally, the first aspect of the present invention also relates to a use of the first composition for manufacturing a semiconductor element surface protective film or an interlayer insulating film.

A phenolic resin composition according to the second aspect of the present invention is a phenolic resin composition comprising a phenolic resin and a solvent. The phenolic resin composition is characterized in that, when the composition is spin-coated on a silicon wafer; the silicon wafer and the spin-coated film are heated at 100° C. for three minutes on a hot plate; the spin-coated film is cured at 250° C. for one hour under a nitrogen atmosphere to obtain a cured product having a thickness of 10 μm; the cured product is cut with the width of 3 mm by a dicing saw and treated with a 23% by mass of hydrofluoric acid aqueous solution to separate the silicon wafer; the cured film is allowed to stand for 24 hours or longer in the atmosphere having the temperature of 23° C. and the humidity of 50% to obtain 20 samples; and the 20 samples are measured by a tensile tester, and an average of five highest values of tensile elongation in the samples is 20% or more.

Hereinafter, a description will be given of the "tensile elongation" that characterizes the phenolic resin composition according to the second aspect of the present invention.

<Tensile Elongation>

The reliability of a surface protective film or interlayer insulating film that is applied to semiconductor devices means that even throughout a series of steps of sputtering, annealing, etching, hardening (curing) of a surface protective film, adhesion to a die-attach film, connections between semiconductor chips, connections between the semiconductor chips and interposers, wiring bonding, injection of an under filling, molding with a sealing resin, solder reflow, burn-in, and the like in the downstream process of manufacturing of a semiconductor device, the resulting product can operate normally as a semiconductor device. The reliability is considered to be the general performance of the surface protective film or interlayer insulating film.

However, the present inventors believe that, during the above-mentioned series of various steps, the film is subjected to a thermal history and stress is generated due to a difference in coefficient of thermal expansion between different types of materials in the semiconductor device, causing deflection of the semiconductor device, and when the surface protective film, the interlayer insulating film or the like cannot resist the deflection, a defect, such as a crack occurs in the film, inhibiting reduction of stress due to a sealing resin filler, insulation properties, α-ray shielding effect, and the like, which are primarily expected from the surface protective film, the interlayer insulating film or the like.

Therefore, the present inventors investigated tensile elongations of films serving as a surface protective film, an interlayer insulating film or the like, and found that, when an average of tensile elongation values measured under the specific conditions as described above is a specific value (namely, about 20%) or more, even if any deflection occurs, the film has no defect, such as a crack, and thus maintained the expected functions.

The average value of tensile elongation is, from the viewpoint of the reliability, preferably 25% or more, more preferably 50% or more, and still more preferably 54% or more. It is more preferable as the upper limit value of the average value of tensile elongation is larger, and for example, the upper limit value is 100%.

The method and conditions for measuring the tensile elongation are as follows:

A phenolic resin composition is spin-coated on a silicon wafer, and the silicon wafer and the spin-coated film are heated at 100° C. for three minutes on a hot plate. Then, under a nitrogen atmosphere, the spin-coated film is cured at 250° C. for one hour to obtain a cured product having a thickness of 10 μm. The cured product is cut with the width of 3 mm by a dicing saw and treated with a 23% by mass of hydrofluoric acid aqueous solution to separate the silicon wafer. Furthermore, the cured and cut film is allowed to stand for 24 hours or longer in the atmosphere of the temperature of 23° C. and the humidity of 50% to obtain 20 samples. Tensile elongation of each sample is measured by a tensile tester (for example, TENSILON (registered trade mark, manufactured by Orientec Inc)). Among the results of the 20 samples, an average of five highest values of the samples is obtained. Conditions for measurement by the tensile tester are as follows:

Temperature: 23° C.
Humidity: 50%
Initial sample length: 50 mm
Testing speed: 40 ram/min.
Load cell rating: 2 kgf <Young's Modulus>

In addition, in the second aspect of the present invention, suitably, the Young's modulus of a film obtained by thermally curing the phenolic resin composition is smaller, since the film can begin to be deformed even by smaller stress and therefore can exhibit stress relaxation function. The Young's modulus thereof is preferably less than 4.0 GPa, more preferably less than 3.5 GPa, and most preferably less than 3.0 GPa. On the other hand, when considering heat resistance and the like of the film, the Young's modulus of the film is preferably 1.0 GPa or more, and more preferably 1.5 GPa or more.

The method and conditions for measuring the Young's modulus are as follows.

<Young's Modulus Measurement Method>

Under the same conditions as those for the above tensile elongation measurement, film formation, sample production, and measurements are carried out. From an S-S curve obtained, Young's modulus is calculated according to JIS K-7161. Among the values of the 20 samples, an average of five lowest values of the samples is employed.

<Phenolic Resin Composition>

The phenolic resin composition according to the second aspect of the present invention (hereinafter also referred to as "second composition") is a composition in which, based on resins having a weight average molecular weight of 1,500 or more included in the composition, a phenolic resin is included in an amount of 55% by mass or more, preferably 75% by mass or more, more preferably 95% by mass or more, and most preferably 100% by mass.

Ingredients forming the second composition will be described below.

<Phenolic Resin>

The phenolic resin used in the second composition is a high-molecular compound comprising a phenolic derivative in a repeating unit thereof. Specific examples of the phenolic resin include a resin obtained by polymerizing the phenolic derivative with an aldehyde compound, a ketone compound, a methylol compound, or an alkoxymethyl compound; a phenol/diene-based polymerization resin; a polyhydroxystyrene-based resin; and a derivative of any thereof. In addition, the weight average molecular weight of the phenolic resin used in the second composition is 1,500 or more.

Hereinafter, a description will be given of the resin obtained by polymerizing the phenolic derivative with an aldehyde compound, a ketone compound, a methylol compound, or an alkoxymethyl compound.

Examples of the phenolic derivative includes, for example, phenol, cresol, ethylphenol, propylphenol, butylphenol, amylphenol, benzylphenol, adamantanephenol, benzyloxyphenol, xylenol, catechol, resorcinol, ethyl resorcinol, hexylresorcinol, hydroquinone, pyrogallol, phloroglucinol, 1,2,4-trihydroxybenzene, pararosolic acid, biphenol, bisphenol A, bisphenol AF, bisphenol B, bisphenol F, bisphenol S, dihydroxydiphenylmethane, 1,1-bis(4-hydroxyphenyl)cyclohexane, 1,4-bis(3-hydroxyphenoxybenzene), 2,2-bis(4-hydroxy-3-methylphenyl)propane, α,α'-bis(4-hydroxyphenyl)-1,4-diisopropylbenzene, 9,9-bis(4-hydroxy-3-methylphenyl)fluorene, 2,2-bis(3-cyclohexyl-4-hydroxyphenyl)propane, 2,2-bis(2-hydroxy-5-biphenylyl)propane, dihydroxybenzoic acid, etc.

Examples of the aldehyde compound include formaldehyde, paraformaldehyde, acetaldehyde, propionaldehyde, pivalaldehyde, butylaldehyde, pentanal, hexanal, trioxane, glyoxal, cyclohexylaldehyde, diphenylacetaldehyde, ethylbutylaldehyde, benzaldehyde, glyoxylic acid, 5-norbornene-2-carboxyaldehyde, malondialdehyde, succindialdehyde, glutaraldehyde, salicylaldehyde, naphthaldehyde, terephthalaldehyde, etc.

Examples of the ketone compound include acetone, methylethylketone, diethylketone, dipropylketone, dicyclohexylketone, dibenzylketone, cyclopentanone, cyclohexanone, bicyclohexanone, cyclohexanedione, 3-butyn-2-one, 2-norbornanone, adamantanone, 2,2-bis(4-oxocyclohexyl)propane, etc.

Examples of the methylol compound include 1,3-bis(hydroxymethyl)urea, ribitol, arabitol, allitol, 2,2-bis(hydroxymethyl)butyric acid, 2-benzyloxy-1,3-propanediol, cyclohexanedimethanol, 2,2-dimethyl-1,3-propanediol, 2,2-diethyl-1,3-propanediol, monoacetin, 2-methyl-2-nitro-1,3-propanediol, 5-norbornene-2,2-dimethanol, 5-norbornene-2,3-dimethanol, pentaerythritol, 2-phenyl-1,3-propanediol, trimethylolethane, trimethylolpropane, 3,6-bis(hydroxymethyl)durene, 2,6-bis(hydroxymethyl)-p-cresol, 2,3-bis(hydroxymethyl)naphthalene, 2,2'-bis(hydroxymethyl)diphenylether, 1,8-bis(hydroxymethyl)anthracene, 2,6-bis(hydroxymethyl)-1,4-dimethoxybenzene, 4,4'-biphenyldimethanol, 1,4-benzenedimethanol, 2-nitro-p-xylylene glycol, 1,3-benzenedimethanol, etc.

Examples of the alkoxymethyl compound include 1,4-bis(methoxymethyl)benzene, 4,4'-bis(methoxymethyl)biphenyl, 1,3,4,6-tetrakis(methoxymethyl)glycoluril, 2,4,6-tris[bis(methoxymethyl)amino]-1,3,5-triazine, etc.

The phenol/diene-based polymerization resin can be obtained by polymerizing a phenolic derivative and a diene-based compound. As the phenolic derivative, the same ones as those mentioned above can be used. Examples of the diene-based compound include butadiene, pentadiene, hexadiene, heptadiene, octadiene, 3-methyl-1,3-butadiene, 1,3-butanediol-dimethacrylate, 2,4-hexadiene-1-ol, methylcyclohexadiene, cyclopentadiene, cyclohexadiene, cyclohexadiene, cyclooctadiene, dicyclopentadiene, 1-hydroxydicyclopentadiene, 1-methylcyclopentadiene, methyldicyclo-pentadiene, diallylether, diallylsulfide, diallyl adipate, 2,5-norbornadiene, tetrahydroindene, 5-ethylidene-2-norbornene, 5-vinyl-2-norbornene, triallyl cyanurate, diallyl isocyanurate, triallyl isocyanurate, diallyl propyl isocyanurate, etc.

The polyhydroxystyrene-based resin can be obtained by additional polymerization of an unsaturated bond-containing phenolic derivative. In the case of synthesizing a resin in which the additional polymerization of an unsaturated bond-containing phenolic derivative is performed, examples of the phenolic derivative include hydroxystyrene, dihydroxy styrene, allylphenol, coumaric acid, hydroxychalcone, N-hydroxyphenyl-5-norbornene-2,3-dicarboxylic acid imide, resveratrol, hydroxystilbene, etc.

The above phenolic derivatives can be resinified by polymerizing through dehydration, dealcoholization, or cleavage of the unsaturated bond. A catalyst may be used upon the polymerization. Examples of acidic catalysts include hydrochloric acid, sulfuric acid, nitric acid, phosphoric acid, phosphorous acid, methanesulfonic acid, p-toluenesulfonic acid, dimethyl sulfate, diethyl sulfate, acetic acid, oxalic acid, 1-hydroxyethylidene-1,1'-diphosphonate, zinc acetate, boron trifluoride, a boron trifluoride-phenol complex, a boron trifluoride-ether complex, etc. On the other hand, examples of alkaline catalysts include lithium hydroxide, sodium hydroxide, potassium hydroxide, calcium hydroxide, barium hydroxide, sodium carbonate, triethylamine, pyridine, 4-N,N-dimethylaminopyridine, piperidine, piperazine, 1,4-diazabicyclo[2.2.2]octane, 1,8-diazabicyclo[5.4.0]-7-undecene, 1,5-diazabicyclo[4.3.0]-5-nonen, ammonia, hexamethylenetetramine, etc.

The phenolic resin may be prepared by copolymerization of a plurality of ingredients, and upon the copolymerization thereof, a compound having no phenolic hydroxyl group may be used in a part of the phenolic derivative.

A weight average molecular weight of the phenolic resin is preferably 1,500 to 200,000, more preferably 1,500 to 100,000, and most preferably 2,000 to 50,000.

The second composition is characterized in that it has high tensile elongation when formed into a cured film. To do that, it is important to moderate the interaction between polymers integrating hydrogen bonds or the interaction between π-electrons of benzene rings, van der Waals Force, and the like. Particularly, in order to weaken hydrogen bonds, in the repeating unit of the phenolic resin, a proportion of the number of oxygen atoms and nitrogen atoms to the number of carbon atoms is preferably 0.1 or less, more preferably 0.08 or less, and most preferably 0.06 or less. In addition, in the repeating unit of the phenolic resin, when a proportion of the number of hydrogen atoms and nitrogen atoms to the number of carbon atoms is 0.01 or more, the interaction between polymers including hydrogen bonds falls in a moderate range.
<Solvent>

Examples of a solvent used in the second composition include amides, sulfoxides, ureas, ketones, esters, lactones, ethers, halogenated hydrocarbons, hydrocarbons, etc. For example, there may be used N-methyl-2-pyrrolidone, N,N-dimethylacetoamide, N,N-dimethylformamide, dimethylsulfoxide, tetramethylurea, acetone, methylethylketone, methyl isobutyl ketone, cyclopentanone, cyclohexanone, methyl acetate, ethyl acetate, butyl acetate, diethyl oxalate, ethyl lactate, methyl lactate, butyl lactate, γ-butyrolactone, propylene glycol monomethyl ether acetate, propylene glycol monomethyl ether, benzyl alcohol, phenyl glycol, tetrahydrofurfuryl alcohol, ethylene glycol dimethyl ether, diethylene glycol dimethyl ether, tetrahydrofuran, morpholine, dichloromethane, 1,2-dichloroethane, 1,4-dichlorobutane, chlorobenzene, o-dichlorobenzene, anisole, hexane, heptane, benzene, toluene, xylene, mesitylene, etc. Among them, from the viewpoint of resin solubility, resin composition stability, adhesion to a substrate, preferred are N-methyl-2-pyrrolidone, dimethylsulfoxide, tetramethylurea, butyl acetate, ethyl lactate, γ-butyrolactone, propylene glycol monomethyl ether acetate, propylene glycol monomethyl ether, benzyl alcohol, phenyl glycol, and tetrahydrofurfuryl alcohol.

An amount of the solvent added to the second composition is in a range of 100 to 1000 parts by mass, preferably 120 to 700 parts by mass, and more preferably 150 to 500 parts by mass, with respect to 100 parts by mass of the phenolic resin.
<Crosslinking Agent>

Preferably, the second composition comprises a crosslinking agent. Examples of the crosslinking agent include epoxy compounds, such as 1,1,2,2-tetra(p-hydroxyphenyl)ethane tetraglycidyl ether, glycerol triglycidyl ether, ortho-sec-butylphenyl glycidyl ether, 1,6-bis(2,3-epoxypropoxy)naphthalene, diglycerol polyglycidyl ether, polyethylene glycol glycidyl ether, triglycidyl isocyanurate, EPICLON 830, 850 and 1050, N-680, N-690, N-695, N-770, HP-7200, HP-820, and EXA-4850-1000 (trade names, manufactured by DIC Co., Ltd.) and DENACOL EX-201, EX-313, EX-314, EX-321, EX-411, EX-511, EX-512, EX-612, EX-614, EX-614B, EX-731, EX-810, EX-911, and EM-150 (trade names, manufactured by Nagase ChemteX Corporation); oxetane compounds, such as xylylene bisoxetane and 3-ethyl-3{[(3-ethyloxetane-yl)methoxy]methyl}oxetane; oxazoline compounds, such as 2,2'-bis(2-oxazoline), 2,2'-isopropylidenebis(4-phenyl-2-oxazoline), 1,3-bis(4,5-dihydro-2-oxazolyl)benzene, 1,4-bis(4.5-dihydro-2-oxazolyl)benzene, EPOCROS K-2010E, K-2020E, K-2030E, WS-500, WS-700, and RPS-1005 (trade names, manufactured by Nippon Shokubai Co., Ltd.); carbodiimide compounds, such as CARBODILITE SV-02, V-01, V-02, V-03, V-04, V-05, V-07, V-09, E-01, E-02, and LA-1 (trade names, manufactured by Nisshinbo Chemical Inc.); aldehydes and aldehyde-modified products, such as formaldehyde, glutaraldehyde, hexamethylene tetramine, trioxane, glyoxal, malondialdehyde, and succindialdehyde; isocyanate-based crosslinking agents, such as 4,4'-diphenylmethane diisocyanate, tolylene diisocyanate, 1,3-phenylenebismethylene diisocyanate, dicyclohexylmethane-4,4'-diisocyanate, isophorone diisocyanate, hexamethylene diisocyanate, TAKENATE 500 and 600, and COSMONATE NBDI and ND (trade names, manufactured by Mitsui Chemicals Co., Ltd.), DURANATE 17B-60PX, TPA-B80E, MF-B60X, MF-K60X, and E402-B80T (trade names, manufactured by Asahi Kasei Chemicals Corporation);

metal chelating agents, such as acetylacetone aluminium (III) salt, acetylacetone titanium(IV) salt, acetylacetone chromium(III) salt, acetylacetone magnesium(II) salt, acetylacetone nickel(II) salt, trifluoroacetylacetone aluminium(III) salt, trifluoroacetylacetone titanium(IV) salt, trifluoroacetylacetone chromium(III) salt, trifluoroacetylacetone magnesium(II) salt, and trifluoroacetylacetone nickel(II) salt; N-methylol-based compounds, such as NIKALAC MW-30 MH, MW-100LH, BL-60, MX-270, MX-280, and MX-290 (manufactured by Sanwa Chemical Co., Ltd.) and CYMEL 300, 303, and 1123, and MYCOAT 102 and 105 (manufactured by Nihon Cytec Industries Inc.); C-methylol-based compounds, such as 1,4-bis(methoxymethyl)benzene and 4,4'-bis(methoxymethyl)biphenyl; and unsaturated bond-containing compounds, such as vinyl acetate, trimethylolpropane trimethacrylate, triallyl 1,3,5-benzenetricarboxylate, triallyl trimellitate, tetra-allyl pyromellitate, pentaerythritol pentaacrylate, dipentaerythritol pentaacrylate, trimethylolpropane triacrylate, ditrimethylolpropane tetraacrylate, NK ESTER 1G, 2G, 3G, 4G, 9G, 14G, NPG, BPE-100, BPE-200, BPE-500, BPE-1400, A-200, A-400, A-600, TMPT, and A-TMM-3 (trade names, manufactured by Shin-Nakamura Chemical Co., Ltd.), and BANI-M and BANI-X (trade names, manufactured by Maruzen Petrochemical Co., Ltd), etc.

Among the above-mentioned crosslinking agents, from the viewpoint of elongation and heat resistance of an obtained thermally cured film, preferred are EPICLON 830, 850, 1050, N-680, N-690, N-695, N-770, HP-7200, HP-820, EXA-4850-1000, DENACOL EX-201, EX-313, EX-314, EX-321, EX-411, EX-511, EX-512, EX-612, EX-614, EX-614B, EX-731, EX-810, EX-911, and EM-150, xylylene bisoxetane, 3-ethyl-3{[(3-ethyloxetane-yl)methoxy]methyl}oxetane, 1,3-bis(4,5-dihydro-2-oxazolyl)benzene, NIKALAC MW-30 MH, MW-100LH, BL-60, MX-270, MX-280, and MX-290, CYMEL 300, 303, and 1123, MYCOAT 102 and 105, 1,4-bis(methoxymethyl)benzene, 4,4'-bis(methoxymethyl)biphenyl, vinyl acetate, trimethylolpropane trimethacrylate, triallyl 1,3,5-benzenetricarboxylate, triallyl trimellitate, tetra-allyl pyromellitate, pentaerythritol pentaacrylate, dipentaerythritol pentaacrylate, trimethylolpropane triacrylate, ditrimethylolpropane tetraacrylate, BANI-M and BANI-X.

In the case of using a crosslinking agent, an amount of the crosslinking agent added is preferably 0.1 to 30 parts by mass with respect to 100 parts by mass of the phenolic resin.
<Photosensitizer>

Preferably, the second composition comprises a photosensitizer. Selecting the type of the photosensitizer allows the second composition to be a positive type or a negative type. To allow the second composition to be a positive type, it is necessary to select a photo acid-generating agent as the photosensitizer. The photo acid-generating agent that may be used includes, naphthoquinone diazide (NQD) compounds, onium salts, halogen-containing compounds, etc. From the viewpoint of solubility in a solvent and preservation stability, preferred are photoactive compounds having an NQD structure described below.

The onium salts include iodonium salts, sulfonium salts, phosphonium salts, ammonium salts, diazonium salts, etc., and preferred is an onium salt selected from the group consisting of diaryliodonium salts, triarylsulfonium salts, and trialkylsulfonium salts.

The halogen-containing compounds include haloalkyl group-containing hydrocarbon compounds, etc., and trichloromethyl triazine is preferable.

The naphthoquinonediazide compounds include compounds having a 1,2-benzoquinonediazide structure or 1,2-naphthoquinonediazide structure, which are, for example, described in U.S. Pat. No. 2,772,972, U.S. Pat. No. 2,797,213, U.S. Pat. No. 3,669,658, and the like. The naphthoquinonediazide structure is at least one compound (hereinafter also referred to as "NQD compound") selected from the group consisting of 1,2-naphthoquinonediazide-4-sulfonates of polyhydroxy compounds having a specific structure described in detail below and 1,2-naphthoquinonediazide-5-sulfonates of the polyhydroxy compounds.

The NQD compound can be obtained according to a usual method by reacting a naphthoquinonediazide sulfonic acid compound with chlorosulfuric acid or thionyl chloride to obtain sulfonyl chloride, and performing a condensation reaction between the obtained naphthoquinonediazide-sulfonyl chloride and a polyhydroxy compound. For example, the NQD compound can be obtained by reacting a polyhydroxy compound with a predetermined amount of 1,2-naphthoquinonediazide-5-sulfonylchloride or 1,2-naphthoquinonediazide-4-sulfonylchloride in a solvent, such as dioxane, acetone, or tetrahydrofuran in the presence of a basic catalyst, such as triethylamine, to perform esterification, and then washing with water and drying the obtained product.

Examples of preferable NQD compounds include, for example, the following:

[Chemical Formula 11]

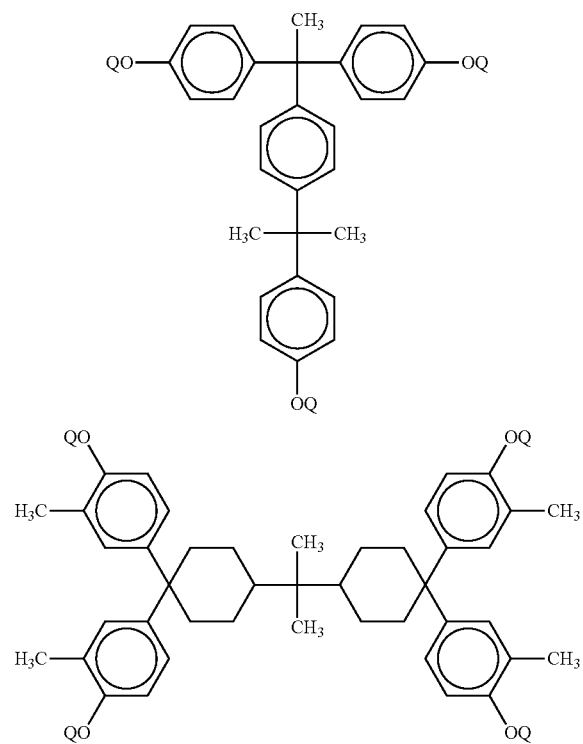

-continued

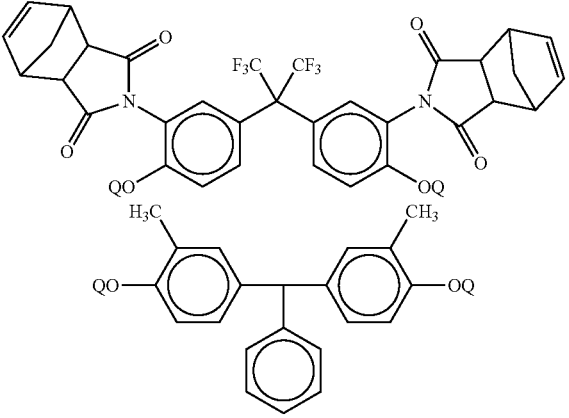

(in which Q is a hydrogen atom or a naphthoquinonediazidesulfonate group below:

[Chemical Formula 12]

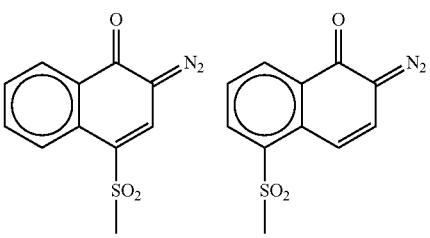

and all Qs are not simultaneously hydrogen atoms).

In addition, a naphthoquinonediazide sulfonyl ester compound having both a 4-naphthoquinonediazide sulfonyl group and a 5-naphthoquinonediazide sulfonyl group in the same molecule thereof, or a mixture of a 4-naphthoquinonediazide sulfonyl ester compound and a 5-naphthoquinonediazide sulfonyl ester compound may be used.

In the second aspect of the present invention, an amount of the photosensitizer added with respect to 100 parts by mass of the phenolic resin is preferably 1 to 50 parts by mass, and more preferably 5 to 30 parts by mass. When the amount of the photosensitizer added is 1 part by mass or more, patterning properties of the resin is favorable. When the amount thereof is 50 parts by mass or less, a cured film preferably has high tensile elongation rate, and there is little development residue (scum) on an exposed area.

<Others>

The second composition may also comprise, as needed, a dye, a surfactant, an adhesion aid for increasing adhesion to a substrate, a dissolution accelerator, a crosslinking accelerator, and/or the like.

The dye includes, for example, methyl violet, crystal violet, malachite green, etc. An amount of the dye added is preferably 0.1 to 30 parts by mass with respect to 100 parts by mass of the phenolic resin.

In addition to nonionic surfactants composed of polyglycols, such as, for example, polypropylene glycol and polyoxyethylene lauryl ether or derivatives thereof, the surfactant includes, for example, fluorine-based surfactants, such as FLUORAD (registered trade mark, trade name, manufactured by Sumitomo 3M Limited), MEGAFAC (registered trade mark, trade name, manufactured by Dainippon Ink & Chemicals, Inc.), and LUMIFLON (registered trade mark, trade name, manufactured by Asahi Glass Co., Ltd), and organic siloxane surfactants, such as, for example, KP 341 (trade name, manufactured by Shi-Etsu Chemical Co., Ltd.), DBE (trade name, manufactured by Chisso Corporation), and GLANOL (trade name, manufactured by Kyoeisha Chemical Co., Ltd).

In the case of using a surfactant, an amount of the surfactant added is preferably 0.01 to 10 parts by mass with respect to 100 parts by mass of the phenolic resin.

The adhesion aid includes, for example, alkyl imidazoline, butyric acid, alkyl acid, polyhydroxystyrene, polyvinylmethylether, t-butyl novolac, epoxy silane, epoxy polymers, etc., as well as various types of alkoxy silanes.

Preferable examples of alkoxy silanes include, for example, tetraalkoxy silane, bis(trialkoxysilyl)methane, bis(trialkoxysilyl)ethane, bis(trialkoxysilyl)ethylene, bis(trialkoxysilyl)hexane, bis(trialkoxysilyl)octane, bis(trialkoxysilyl)octadiene, bis[3-(trialkoxysilyl)propyl]disulfide, N-phenyl-3-aminopropyl trialkoxysilane, 3-mercaptopropyl trialkoxysilane, 2-(trialkoxysilylethyl)pyridine, 3-methacryloxypropyl trialkoxysilane, 3-methacryloxypropyl dialkoxyalkylsilane, vinyltrialkoxysilane, 3-ureidopropyl-trialkoxysilane, 3-isocyanatepropyl-trialkoxysilane, 3-(trialkoxysilyl)propyl succinic anhydride, N-(3-trialkoxysilylpropyl)-4,5-dihydro-imidazole, 2-(3,4-epoxycyclohexyl)ethyl trialkoxysilane, 3-glycidoxypropyl trialkoxysilane, 3-glycidoxypropyl dialkoxyalkylsilane, reaction products of 3-aminopropyl trialkoxysilane and 3-aminopropyl dialkoxyalkylsilane with acid anhydride or acid dianhydride, 3-aminopropyl trialkoxysilane or 3-aminopropyl dialkoxyalkylsilane in which amino groups have been substituted with urethane groups or urea groups, etc. In addition, alkyl groups in the above-mentioned compounds include methyl, ethyl, propyl, butyl groups, etc.; the acid anhydride includes maleic anhydride, phthalic anhydride, 5-norbornene-2,3-dicarboxylic acid anhydride, etc.; the acid dianhydride includes pyromellitic dianhydride, 3,3',4,4'-benzophenone tetracarboxylic acid dianhydride, 4,4'-oxydiphthalic dianhydride, etc.; the urethane group includes a t-butoxycarbonylamino group, etc.; and the urea group includes a phenylaminocarbonylamino group, etc.

In the case of using an adhesion aid, an amount of the adhesion aid added is preferably 0.1 to 30 parts by mass with respect to 100 parts by mass of the phenolic resin.

The dissolution accelerator is preferably a compound having a hydroxyl group or a carboxyl group. Examples of compounds having a hydroxyl group include linear phenolic compounds, such as ballasting agents used as the above-mentioned naphthoquinoneazide compounds, p-cumylphenols, bisphenols, resorcinols, MtrisPC, and MtetraPC; nonlinear phenolic compounds, such as TrisP-HAP, TrisP-PHBA, and TrisP-PA (all manufactured by Honshu Chemical Industry Co. Ltd.); 2 to 5 phenolic substituents of diphenylmethane, 1 to 5 phenolic substitutents of 3,3'-diphenylpropane, a 1:2 reaction product of 2,2-bis-(3-amino-4-hydroxyphenyl)hexafluoropropane and 5-norbornene-2,3-dicarboxylic acid anhydride, a 1:2 reaction product of bis-(3-amino-4-hydroxyphenyl)sulfone and 1,2-cyclohexyldicarboxylic acid anhydride, N-hydroxy succinimide, N-hydroxyphthalic imide, N-hydroxy 5-norbornene-2,3-dicarboxylic acid imide, etc.

Examples of compounds having a carboxyl group include 3-phenyllactic acid, 4-hydroxyphenyllactic acid, 4-hydroxymandelic acid, 3,4-dihydroxymandelic acid, 4-hydroxy-3-methoxymandelic acid, 2-methoxy-2-(1-naphthyl)propionic acid mandelic acid, atrolactic acid, acetylmandelic acid, α-methoxyphenylacetic acid, O-acetylmandelic acid, etc.

In the case of using a dissolution accelerator, an amount of the dissolution accelerator added is preferably 0.1 to 30 parts by mass with respect to 100 parts by mass of the phenolic resin.

The crosslinking accelerator is preferably a compound that generates acid, base, or radicals by means of heat or light. Compounds that generate acid by means of heat or light include onium salts, such as TPS-105 and 1000, DTS-105, NDS-105, and 165 (trade names, manufactured by Midori Kagaku Co., Ltd.) and DPI-DMAS, TTBPS-TF, TPS-TF, and DTBPI-TF (trade names, manufactured by Toyo Gosei Co., Ltd.); sulfonates, such as methyl methanesulfonate, ethyl methanesulfonate, methyl benzenesulfonate, methyl p-toluenesulfonate, and methoxyethyl p-toluenesulfonate; oxime sulfonates, such as NAI-100, 101, 105 and 106, and PAI-101 (trade names, manufactured by Midori Kagaku Co., Ltd.) and IRGACURE PAG-103, 108, 121 and 203, CGI-1380 and 725, NIT, 1907, and PNBT (trade names, manufactured by BASF Japan Inc.), etc. Compounds that generate base by means of heat or light include amine salts, such as U-CATSA-1, 102, 506, 603, and 810 (trade names, manufactured by San-Apro Ltd.) and CGI-1237, 1290, and 1293 (trade names, manufactured by BASF Japan Inc.), compounds in which amino groups, such as 2,6-piperidine or butylamine, diethylamine, dibutylamine, N,N'-diethyl-1,6-diaminohexane, and hexamethylenediamine have been replaced with urethane groups or urea groups. The urethane groups include t-butoxycarbonylamino groups, etc., and the urea groups include phenylaminocarbonylamino groups, etc. Compounds that generate radicals by means of heat or light include alkylphenones, such as IRGACURE 651, 184, 2959, 127, 907, 369, and 379 (trade names, manufactured by BASF Japan Inc.), acylphosphine oxides, such as IRGACURE 819 (trade name, manufactured by BASF Japan Inc.); titanocenes, such as IRGACURE 784 (trade name, manufactured by BASF Japan Inc.); oxime esters, such as IRGACURE OXE 01 and 02 (trade names, manufactured by BASF Japan Inc.), etc.

<Method for Forming Cured Relief Pattern>

Hereinafter, an example of a method for forming a cured relief pattern on a substrate will be explained, in the case of using, as the second composition, a composition containing a photosensitizer.

First, the second composition containing a photosensitizer is applied onto an appropriate support or a substrate, for example, a silicon wafer, a ceramic, an aluminum substrate, or the like. At that time, to ensure water-resistant adhesion between a pattern to be formed and the support, an adhesion aid, such as a silane coupling agent may be previously applied onto the support or substrate. The composition may be applied by spin coating using a spinner, spray coating using a spray coater, dipping, printing, roll coating, or the like. Next, after drying the coated film by prebaking at 80 to 140° C., the phenolic resin composition is exposed to light. A chemical ray that may be used for exposure include X ray, electron beam, UV ray, visible light, etc., and preferably has a wavelength of 200 to 500 nm. In terms of pattern resolution and handling, the light source wavelength is preferably a wavelength of g-ray, h-ray, or i-ray of a mercury lamp, and those rays may be used alone or in combination. As the exposure apparatus, a contact aligner, a mirror projection, and a stepper are particularly preferable.

Next, development will be carried out. The development method can be selected from dipping, paddling, spin spraying, and the like. Development allows an exposed area or non-exposed area to be eluted and removed from the coated phenolic resin composition to obtain a relief pattern. Developers that may be used include aqueous solutions of inorganic alkalises, such as sodium hydroxide, sodium carbonate, sodium silicate, and an ammonia solution; organic amines, such as ethylamine, diethylamine, triethylamine, and triethanolamine; and quaternary ammonium salts, such as tetramethylammonium hydroxide and tetrabutylammonium hydroxide, as well as, if needed, aqueous solutions of those prepared by adding an appropriate amount of a water-soluble organic solvent, such as methanol or ethanol, or a surfactant. Above all, an aqueous solution of tetramethylammonium hydroxide is preferable. The concentration thereof is preferably 0.5 to 10% by mass, and more preferably 1.0 to 5% by mass.

After development, cleaning is carried out with a rinsing liquid to remove the developer, thereby obtaining a pattern film. Distilled water, methanol, ethanol, isopropanol, or the like may be used alone or in combination, as the rinsing liquid.

Finally, the relief pattern obtained in this manner is heated, whereby a cured relief pattern can be obtained. The heating temperature is preferably from 150° C. to 280° C.

In a method for forming a cured relief pattern by using a commonly used polyimide or polybenzoxazole precursor composition, it is necessary to convert the precursor composition to polyimide or polybenzoxazole by heating it to 300° C. or higher, so as to allow dehydrative cyclization reaction to proceed. However, in the method for manufacturing a cured relief pattern according to the second aspect of the present invention, it is unnecessary to do that, so that the composition of the present invention can be suitably used even for semiconductor devices and the like which are easily affected by heat. To give an example, the composition of the invention is suitably used for semiconductor devices having an insulating layer made of a high dielectric constant material or a ferroelectric material having a restricted processing temperature, for example, an oxide of a metal having a high melting point, such as titanium, tantalum, or hafnium.

In the case of a semiconductor device without any such a restriction on heat resistance, it is obvious that even in the present method, heating to 300 to 400° C. may be carried out. Such a heating treatment may be done using a hot plate, an oven, or a thermal oven allowing the setting of a temperature program. As an atmospheric gas for heating treatment, air or an inert gas, such as nitrogen or argon may be used. In addition, when heat treatment needs to be carried out at lower temperature, heating may be done under reduced pressure using a vacuum pump or the like.

On the other hand, when the phenolic resin composition is non-photosensitive, a relief pattern may be formed in a step of applying the second composition, or after the application step, processing by laser or the like may be performed, so as to allow the formation of a relief pattern.

When forming a relief pattern in the application step, the phenolic resin composition may be printed/applied in a relief pattern shape by means of screen printing, relief printing, planographic printing, or the like. Alternatively, a relief pattern may be formed by discharging a solution containing the phenolic resin composition from a nozzle by spraying using an inkjet system or a dispenser system or by means of direct drawing using a plotter or the like.

When forming a relief pattern by processing with laser or the like after the application step, after application by spin coating or the like, a laser, for example, an excimer laser or a UV-YAG laser may be used to burn off a region other than the relief pattern, so as to obtain the relief pattern.

After that, as in the case of the above-described photosensitive phenolic resin composition, the obtained relief pattern is heated to obtain a cured relief pattern.

<Semiconductor Device>

In addition, a semiconductor device comprising a semiconductor element and a cured film provided on a top part of the semiconductor element, in which the cured film is a cured relief pattern manufactured using the second composition, is also a part of the second aspect of the present invention. The semiconductor device according to the second aspect of the invention can be manufactured by combining the use of the above-described cured relief pattern as a surface protective film, an interlayer insulating film, an insulating film for rewiring, a protective film for a flip-chip device, or a protective film of a device having a bump structure with steps of a known method for manufacturing a semiconductor device. Additionally, the second aspect of the invention also relates to a use of the second composition for manufacturing a semiconductor element surface protective film or an interlayer insulating film.

EXAMPLES

First Aspect of the Present Invention

Hereinafter, the first aspect of the present invention will be described in detail by way of Examples. However, the invention is not limited thereto.

Synthesis Example

A thermal base-generating agent (D-1) represented by the following formula:

[Chemical Formula 13]

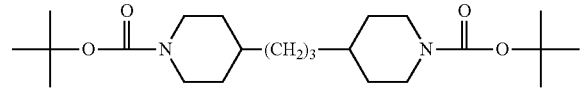

was synthesized according to the following method.

In a 500 mL separable flask, 43.7 g (0.2 mol) of di-t-butyl dicarbonate and 0.25 g (0.002 mol) of 4-N,N-dimethylaminopyridine were placed. While heating up to 35° C. and stirring di-t-butyl dicarbonate and 4-N,N-dimethylaminopyridine, 21.04 g (0.1 mol) of 1,3-di-4-piperidylpropane was added in 30 minutes in such a way that the temperature of the reaction solution did not exceed 40° C. After finishing the addition, the temperature of the reaction solution was increased up to 55° C. and the solution was stirred for eight hours. After finishing the reaction, insoluble matter was filtered off and 200 g of water was added to the filtrate. Then, an organic layer was extracted with ethyl acetate, washed with a sodium bicarbonate aqueous solution, and dried with magnesium sulfate to remove a solvent under reduced pressure, thereby obtaining 32.5 g of the thermal base-generating agent (D-1).

<Preparation of Photopolymer Composition>

Examples 1 to 7 and Comparative Examples 1 to 4

Individual ingredients used in Examples of the present invention and Comparative Examples were respectively as follows:

(A) Ingredient

A-1: MEH-7851 4H manufactured by Meiwa Plastic Industries, Ltd., (weight average molecular weight=9986)

A-2: MEH-7851 H manufactured by Meiwa Plastic Industries, Ltd., (weight average molecular weight=2769)

The weight average molecular weight of ingredient (A) was calculated in terms of standard polystyrene (organic solvent system standard sample: STANDARD SM-105, manufactured by Showa Denko K.K.) by gel permeation chromatography (GPC).

The GPC apparatus used and the measurement conditions were as follows:

Pump: JASCO PU-980

Detector: JASCO RI-930

Column oven: JASCO CO-965 40° C.

Column: Shodex KD-806M; two connected in series

Mobile phase: 0.1 mol/l, EtBr/NMP

Flow rate: 1 ml/min.

The A-1 and the A-2 are MEH-7851 series phenolic resins having a biphenyldiyl structure in the resin skeleton and commercially available from Meiwa Plastic Industries, Ltd., and the A-3 is a cresol-type phenolic resin having no biphenyldiyl structure in the resin skeleton and commercially available from Asahi Organic Chemicals Industry Co. Ltd.

(B) Ingredient

B-1: a photo acid-generating agent represented by the following formula:

[Chemical Formula 14]

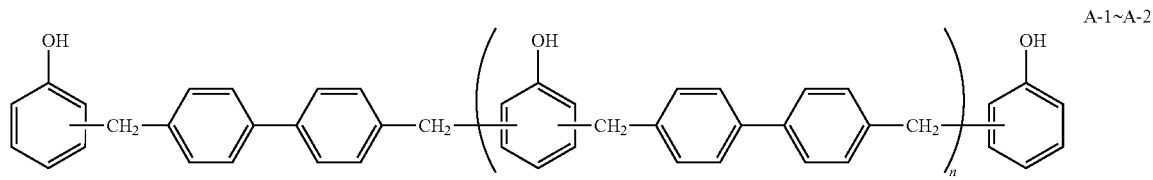

A-3: EP 4020G manufactured by Asahi Organic Chemicals Industry Co. Ltd., (weight average molecular weight=11719)

[Chemical Formula 15]

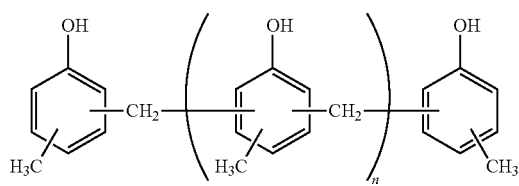

[Chemical Formula 16]

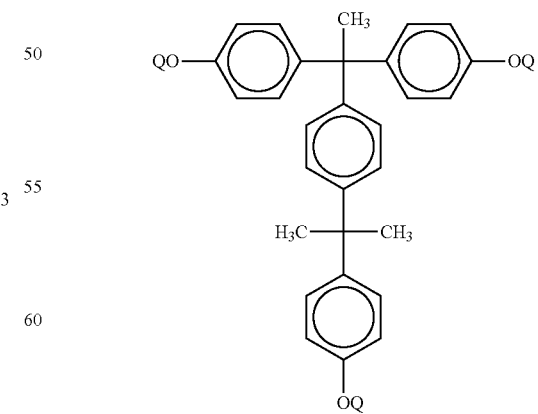

(in which 83% of Q is made of a structure represented by the following:

[Chemical Formula 17]

and the rest thereof is made of hydrogen atoms).

B-2: a photo acid-generating agent represented by the following formula:

[Chemical Formula 18]

(C) Ingredients

C-1: NIKALAC MX-390 manufactured by Sanwa Chemical Co., Ltd.

C-2: NIKALAC MX-270 manufactured by Sanwa Chemical Co., Ltd.

C-3: DENACOL EX-321L manufactured by Nagase ChemteX Corporation

C-4: ETERNACOLL OXBP manufactured by Ube Industries, Ltd.

[Chemical Formula 19]

(D) Ingredient:

D-1:

[Chemical Formula 20]

(E) Solvent

γ-butyrolactone (GBL)

Table 1 below shows the compositions of Examples 1 to 7 and Comparative Examples 1 to 4.

Numerical values given in the Table represent parts by mass of individual ingredients added. After mixing and dissolving the ingredients, the mixture was filtered with a TEFLON (registered trade mark) filter having a pore diameter of 0.2 μm to obtain a photosensitive varnish.

TABLE 1

| Ingredient | | Ex. 1 | Ex. 2 | Ex. 3 | Ex. 4 | Comp. Ex. 1 | Ex. 5 | Comp. Ex. 2 | Ex. 6 | Comp. Ex. 3 | Ex. 7 | Comp. Ex. 4 |
|---|---|---|---|---|---|---|---|---|---|---|---|---|
| (A) | A-1 | 100 | 100 | | | | 100 | | 100 | | 100 | |
| | A-2 | | | 100 | 100 | | | | | | | |
| | A-3 | | | | | 100 | | 100 | | 100 | | 100 |
| (B) | B-1 | 12 | 6 | 12 | 12 | 12 | 12 | 12 | 12 | 12 | | |
| | B-2 | | | | | | | | | | 5 | 5 |
| (C) | C-1 | | | | 30 | | | | | | | |
| | C-2 | 30 | 30 | 30 | | 30 | | | | | 30 | 30 |
| | C-3 | | | | | | 30 | 30 | | | | |
| | C-4 | | | | | | | | 30 | 30 | | |
| (D) | D-1 | | | | | | 20 | 20 | | | | |
| (E) | GBL | 110 | 110 | 100 | 100 | 120 | 110 | 110 | 110 | 110 | 110 | 110 |
| | Elongation (%) | 32 | 20 | 21 | 18 | 7 | 25 | 5 | 12 | No film formed | 30 | 7 |

<Evaluation of Elongation>

Samples for elongation measurement of the present invention were produced according to the following manner:

A 6-inch silicon wafer substrate having an aluminum vapor-deposited layer on an outmost surface thereof was spin-coated with a photopolymer composition obtained in Examples of the present invention and Comparative Examples, and heated at 250° C. for two hours under a nitrogen atmosphere to obtain a resin cured film, so that the post-curing film thickness was about 10 µm. The obtained resin cured film was cut with the width of 3 mm by a dicing saw and then treated with a dilute hydrochloric acid aqueous solution to separate from the wafer, so that twenty samples were obtained. The twenty samples were allowed to stand for 24 hours or longer in the atmosphere having the temperature of 23° C. and the humidity of 50% and then subjected to elongation measurement using a tensile tester (for example, TENSILON). Measurement conditions of the tensile tester were as follows:

Temperature: 23° C.
Humidity: 50%
Initial sample length: 50 mm
Testing speed: 40 mm/min.
Load cell rating: 2 kgf In Examples 1 to 7 using biphenyldiyl-phenolic resins as ingredient (A), the average elongation of cured films (an average value of the 20 samples) had a high value of 8% or more. In contrast, the cured films of Comparative Examples 1 to 4 having no biphenyldiyl structure in the skeleton of ingredient (A) exhibited low average elongation.

Reference Examples

Second Aspect of the Present Invention

Hereinafter, the second aspect of the present invention will be described in detail by way of Reference Examples, although the second aspect of the invention is not limited thereto.

Preparation Example 1

In a 1-L separable flask, 141.2 g (1.5 mol) of phenol was placed and heated to 80° C. in an oil bath while stirring under a nitrogen gas flow. Next, 3.0 g of a boron trifluoride/phenol complex was added. Then, the temperature was further increased to 130° C. and 132.2 g (1.0 mol) of dicyclopentadiene was dropped in two hours. After dropping, the mixture was further stirred at 130° C. for five hours.

After finishing the reaction, the acidic catalyst was neutralized with calcium hydroxide and then, the reaction solution was distilled under reduced pressure to distill/remove the non-reacted phenol, thereby obtaining 203 g of a phenol-dicyclopentadiene resin (P-1). A weight average molecular weight (Mw in terms of polystyrene) of the P-1 measured by GPC was 10200.

Preparation Example 2

In a 1-L separable flask, 75 g of EP 4080G (cresol novolac resin, trade name, manufactured by Asahi Organic Chemicals Industry Co., Ltd.), 19.8 g (0.25 mol) of pyridine, and 125 g of gammer-butyrolactone (GBL) were placed. While stirring the mixture, 23.1 g (0.25 mol) of propionyl chloride was dropped in 10 minutes. After finishing the dropping, the mixture was stirred at room temperature for eight hours.

After finishing the reaction, the reaction solution was dropped in 500 g of water and a precipitate was filtered. An operation of dissolving the filter residue in 150 g of GBL was repeated three times and then, the resulting product was dried under reduced pressure to obtain a cresol novolac resin (P-2) in which 38% of the hydroxyl groups was blocked.

The blocking of 38% of the hydroxyl groups in the P-2 was confirmed by $^1$H NMR indicating that the peak intensity of hydroxyl groups near 9 ppm was 38% lower than in untreated EP 4080G. A weight average molecular weight (Mw in terms of polystyrene) of the P-2 measured by GPC was 4900.

Preparation Example 3

The same operation as Preparation Example 2 was performed, except that the respective amounts of pyridine and propionyl chloride in Preparation Example 2 were changed to 39.6 g (0.50 mol) and 46.3 g (0.50 mol), respectively, thereby obtaining a cresol novolac resin (P-3) in which 76% of the hydroxyl groups was blocked.

The blocking of 76% of the hydroxyl groups in the P-3 was confirmed by $^1$H NMR indicating that the peak intensity of hydroxyl groups near 9 ppm was 76% lower than in untreated EP 4080G. A weight average molecular weight (Mw in terms of polystyrene) of the P-3 measured by GPC was 5100.

Preparation Example 4

In a 500-mL separable flask, 43.7 g (0.2 mol) of di-t-butyl dicarbonate and 0.25 g (0.002 mol) of 4-N,N-dimethylaminopyridine were placed. While stirring the mixture, 17.2 g (0.1 mol) of N,N'-diethyl-1,6-diaminohexane was dropped in 10 minutes. After dropping, the mixture was heated to 50° C. and stirred for eight hours.

After the reaction has finished, 200 g of water was added to the reaction solution. Then, an organic layer was extracted with ethyl acetate, washed with a sodium hydrogen carbonate aqueous solution and a saturated saline dried with magnesium sulfate to distill/remove the solvent under reduced pressure, thereby obtaining 29.5 g of a thermal base-generating agent (TBG-1) in which the amino groups were replaced with urethane groups.

<Preparation of Phenolic Resin Composition>

After obtaining a homogenous solution by mixing individual ingredients listed in Table 2, the solution was filtered with a membrane filter having a pore size of 1 µm to prepare a phenolic resin composition solution.

TABLE 2

| | Elongation (%) | Young's modulus (GPa) | Polymer (100 parts by mass) | | (Oxygen atoms + nitrogen atoms)/ carbon atoms | Crosslinking agent (parts by mass) | Thermal base-generating agent (parts by mass) | Photo-sensitizer (parts by mass) | TC test |
|---|---|---|---|---|---|---|---|---|---|
| | | | Type | Mw | | | | | |
| Ref. Ex. 1 | 74 | 2.9 | MEH-7851-4H | 9,900 | 0.050 | MX270(10) | none | none | A |
| Ref. Ex. 2 | 56 | 2.7 | MEH-7851-4H | 9,900 | 0.050 | MX270(20) | none | none | A |
| Ref. Ex. 3 | 57 | 2.7 | MEH-7851-SS | 1,700 | 0.050 | MX270(30) | none | none | A |
| Ref. Ex. 4 | 77 | 2.5 | MEH-7851-4H | 9,900 | 0.050 | EX321(30) | TBG-1(10) | none | A |
| Ref. Ex. 5 | 31 | 3.1 | MEH-7851-M/ MEH-7500 = 9/1 | 2,400/ 3,500 | 0.060 | MX270(30) | none | TPPA(15) | A |

TABLE 2-continued

| | Elongation (%) | Young's modulus (GPa) | Polymer (100 parts by mass) | | | Crosslinking agent (parts by mass) | Thermal base-generating agent (parts by mass) | Photo-sensitizer (parts by mass) | TC test |
|---|---|---|---|---|---|---|---|---|---|
| | | | Type | Mw | (Oxygen atoms + nitrogen atoms)/ carbon atoms | | | | |
| Ref. Ex. 6 | 22 | 3.7 | MEH-7851-M/ MEH-7500 = 5/5 | 2,400/ 3,500 | 0.091 | MX270(30) | none | TPPA(15) | A |
| Ref. Ex. 7 | 54 | 2.9 | MEH-7851-M/ EP4080G = 8/2 | 2,400/ 4,800 | 0.057 | MX270(30) | none | TPPA(15) | A |
| Ref. Ex. 8 | 28 | 3.0 | MEH-7851-M/ EP4080G = 5/5 | 2,400/ 4,800 | 0.074 | MX270(30) | none | TPPA(15) | A |
| Ref. Ex. 9 | 33 | 2.9 | P-1 | 10200 | 0.063 | MX270(30) | none | none | A |
| Ref. Ex. 10 | 4 | 4.4 | EP4020G | 11,400 | 0.143 | MX270(30) | none | none | B |
| Ref. Ex. 11 | 6 | 4.3 | P-2 | 4,900 | 0.171 | MX270(30) | none | none | B |
| Ref. Ex. 12 | 0 | 0 | P-3 | 5,200 | 0.191 | MX270(30) | none | none | B |
| Ref. Ex. 13 | 17 | 4.1 | MEH-7851-M/ MEH-7500 = 5/5 | 2,400/ 3,500 | 0.113 | MX270(30) | none | TPPA(15) | B |

Materials used in the individual Reference Examples, except for those mentioned in the above preparation examples, are as follows:

Polymer:

MEH-7851-4H (phenol-biphenylene resin, trade name, manufactured by Meiwa Plastic Industries, Ltd.)

MEH-7851-M (phenol-biphenylene resin, trade name, manufactured by Meiwa Plastic Industries, Ltd.)

MEH-7851-SS (phenol-biphenylene resin, trade name, manufactured by Meiwa Plastic Industries, Ltd.)

MEH-7500 (phenol-salicylaldehyde resin, trade name, manufactured by Meiwa Plastic Industries, Ltd.)

EP 4020G (cresol novolac, trade name, manufactured by Asahi Organic Chemicals Industry Co. Ltd.)

EP 4080G (cresol novolac, trade name, manufactured by Asahi Organic Chemicals Industry Co. Ltd.)

Crosslinking Agent:

MX-270 (NIKALAC MX-270, trade name, manufactured by Sanwa Chemical Co., Ltd.

EX-321 (DENACOL EX-321, trade name, manufactured by Nagase ChemteX Corp.)

Photosensitive Agent:

TPPA (represented by the following structure):

[Chemical Formula 21]

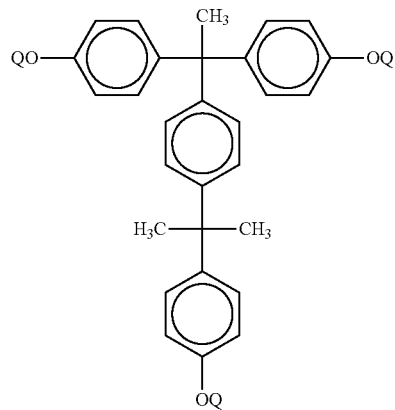

(in which 83% of Qs are made up of a structure below:

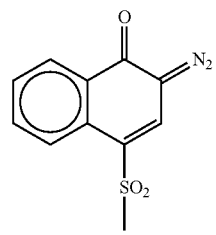

and the rest thereof is made up of hydrogen atoms).

Descriptions regarding the polymers in Table 2 were obtained in the following manner.

<Mw>

The weight average molecular weight, Mw, was calculated in terms of standard polystyrene by gel permeation chromatography (GPC). The GPC apparatus used and the measurement conditions were as follows:

Pump: JASCO PU-980

Detector: JASCO RI-930

Column oven: JASCO CO-965 40° C.

Column: Shodex KD-806M; two connected in series

Mobile phase: 0.1 mol/l, EtBr/NMP

Flow rate: 1 ml/min.

<(Oxygen Atoms+Nitrogen Atoms)/Carbon Atoms>

The proportion of the number of oxygen atoms and nitrogen atoms to the number of carbon atoms is calculated by writing a chemical structural formula of the repeating unit of the phenolic resin and counting the numbers of individual atoms. At that time, even if there are three or more reaction positions in the phenol unit, it is assumed that only two thereof are reactive. For example, in the case of MEH-7851, phenol may react with an aldehyde compound mainly at 2-, 4- and 6-positions. However, assuming that the reaction occurs only at 2- and 6-positions, the chemical structural formula of the repeating unit is as follows:

[Chemical Formula 22]

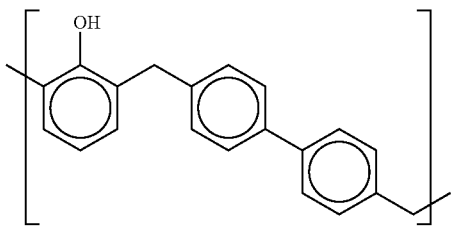

Therefore, (oxygen atoms+nitrogen atoms)/carbon atoms=1/20=0.050.

In the cases of mixing a phenolic resin, the above calculation was performed for each case to obtain a weighted average according to the mixing ratio.

An evaluation item in Table 2 was tested as follows:

<Thermal Cycle (TC) Test>

A silicon wafer was spin-coated with the phenolic resin composition and heated for three minutes on a hot plate at 100° C. Then, curing was carried out at 250° C. for one hour under a nitrogen atmosphere to obtain a cured film having a thickness of 10 μm. The cured film was subjected to a test of 1000 cycles, each at −65 to 135° C. for 30 minutes, by using a thermal cycle chamber TSE-11 (manufactured by Espec Corp). Then, the film surface was observed through an optical microscope. The mark (A) represents films without any crack, whereas the mark (B) represents those with a crack.

<Elongation and Young's Modulus>

A silicon wafer was spin-coated with the phenolic resin composition and heated for three minutes on a hot plate at 100° C. Then, curing was carried out at 250° C. for one hour under a nitrogen atmosphere to obtain a cured film having a thickness of 10 μm. The cured film was cut with the width of 3 mm by a dicing saw and treated with a 23% hydrofluoric acid aqueous solution to separate from the silicon wafer. Then, 20 samples obtained were allowed to stand for 24 hours or longer under the atmosphere having the temperature of 23° C. and the humidity of 50%. After that, tensile elongation was measured by a universal tester TENSILON UTM-II-20 (manufactured by Orientec Inc.), and an average of five highest values was employed. Measurement conditions of the tensile tester are as follows.

Temperature: 23° C.
Humidity: 50%
Initial sample length: 50 mm
Testing speed: 40 mm/min.
Load cell rating: 2 kgf Young's modulus was calculated by obtaining a slope in the elastic region from a resulting S-S curve according to the method of JIS K-7161, and an average of five lowest values was employed.

As obvious from the results of Table 2, in those having a tensile elongation of 20% or more, no crack due to the TC test was found. In addition, in the phenolic resins that have achieved such a result, the proportion of (oxygen atoms+nitrogen atoms)/carbon atoms is smaller, which is not interrelated with the magnitude of molecular weight as a common tool for improving tensile elongation.

Industrial Applicability

According to the first aspect of the present invention, the photopolymer composition for a semiconductor element surface protective film or an interlayer insulating film can be suitably used for semiconductor element surface protective films, such as for surface protective films of semiconductor devices and light emitting devices, protective films for flip-chip devices, and protective films of devices having a bump structure, as well as for interlayer insulating films, such as for insulating films for rewiring and interlayer insulating films of multilayer circuits.

The phenolic composition according to the second aspect of the present invention can be suitably used for surface protective films, interlayer insulating films, and insulating films for rewiring of semiconductor devices and light emitting devices, protective films for flip-chip devices, protective films of devices having a bump structure, interlayer insulating films of multilayer circuits, cover coats of flexible copper clad laminates, solder resist films, liquid crystal alignment films, and the like.

The invention claimed is:

1. A photopolymer composition for a semiconductor element surface protective film or an interlayer insulating film, a solution of the photopolymer composition comprising the following ingredients: 100 parts by mass of (A) a phenolic resin having a biphenyldiyl structure in a main chain of the resin; 1 to 30 parts by mass of (B) a photo acid-generating agent; and 1 to 60 parts by mass of (C) a compound that can be reacted with ingredient (A) by means of an acid generated from ingredient (B) or heat, wherein phenolic resin (A) comprises a repeating unit represented by the following general formula (1):

[Chemical Formula 1]

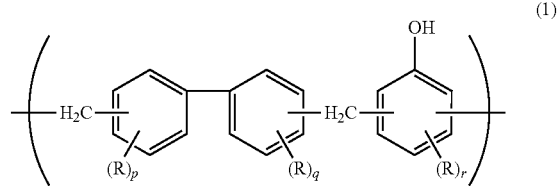

(1)

(in which R is a group selected from the group consisting of a halogen atom, a carboxyl group, a hydroxyl group, an aliphatic group having 1 to 10 carbon atoms, which may have an unsaturated bond, an alicyclic group having 3 to 10 carbon atoms, and an aromatic group having 6 to 20 carbon atoms; a hydrogen atom of each group may be additionally substituted with a halogen atom, a carboxyl group and/or a hydroxyl group; p and q are an integer of 0 to 4; r is an integer of 0 to 3; and when p, q or r is 2 or larger, each R may be the same as or different from the other).

2. The photopolymer composition according to claim 1, wherein the number of repeats of the repeating unit in phenolic resin (A) is from 8 to 100.

3. The photopolymer composition according to claim 1, wherein photo acid-generating agent (B) is an ester compound made from a phenolic compound and 1,2-naphthoquinone-2-diazide-5-sulfonic acid or 1,2-naphthoquinone-2-diazide-4-sulfonic acid.

4. The photopolymer composition according to claim 1, wherein photo acid-generating agent (B) is a compound represented by the following formula:

[Chemical Formula 2]

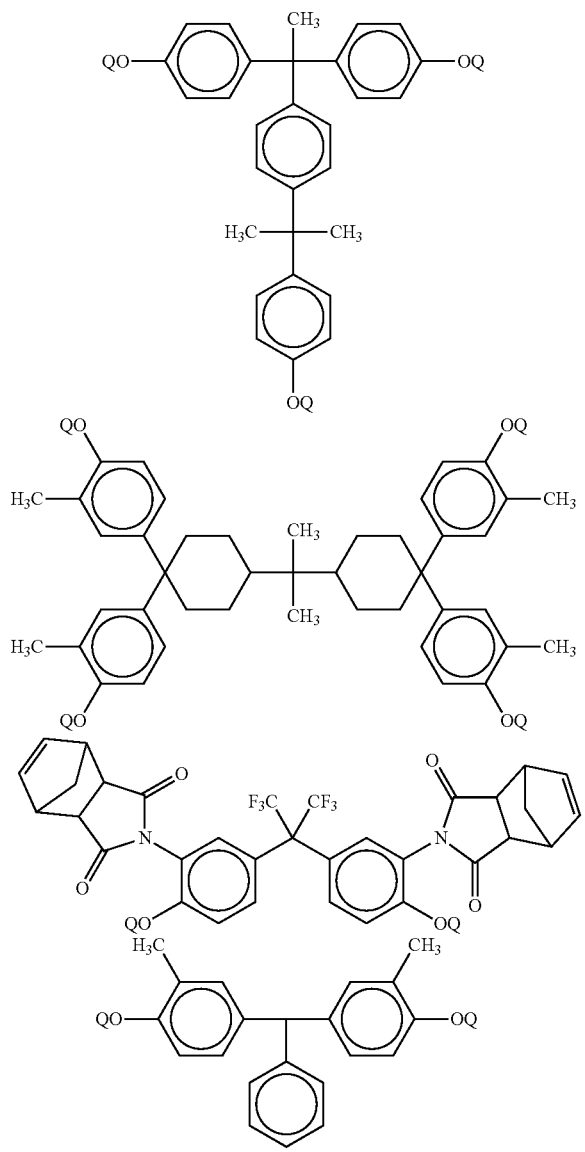

(in which Q is a hydrogen atom or a naphthoquinonediazide sulfonate group represented by the following formula:

[Chemical Formula 3]

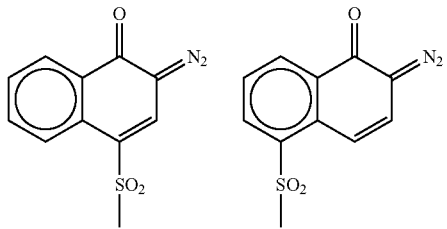

and all Qs are not simultaneously hydrogen atoms).

5. The photopolymer composition according to claim 1, wherein compound (C) has at least two groups selected from the group consisting of an epoxy group, an oxetane group, a —N—($CH_2$—OR') group (in which R' is hydrogen or an alkyl group having 1 to 4 carbon atoms), and a —C—($CH_2$—OR') group (in which R' is hydrogen or an alkyl group having 1 to 4 carbon atoms).

6. The photopolymer composition according to claim 1, further comprising (D) a thermal base-generating agent.

7. A method for manufacturing a semiconductor device, comprising the following steps of:
   forming a photopolymer layer consisting of the photopolymer composition according to claim 1 on a semiconductor substrate;
   exposing the photopolymer layer to actinic light;
   developing the exposed photopolymer layer to obtain a relief pattern; and
   heating the obtained relief pattern.

8. A semiconductor device manufactured by the method according to claim 7.

9. A method for manufacturing a semiconductor element surface protective film or an interlayer insulating film by using the photopolymer composition according to claim 1.

10. A method of manufacturing a semiconductor element surface protective film or an interlayer insulating film by using the photopolymer composition according to claim 1.

11. The photopolymer composition according to claim 1, wherein the number of repeats of the repeating unit in phenolic resin (A) is from 8 to 100.

12. The photopolymer composition according to claim 1, wherein photo acid-generating agent (B) is an ester compound made from a phenolic compound and 1,2-naphthoquinone-2-diazide-5-sulfonic acid or 1,2-naphthoquinone-2-diazide-4-sulfonic acid.

13. The photopolymer composition according to claim 1, wherein photo acid-generating agent (B) is a compound represented by the following formula:

[Chemical Formula 2]

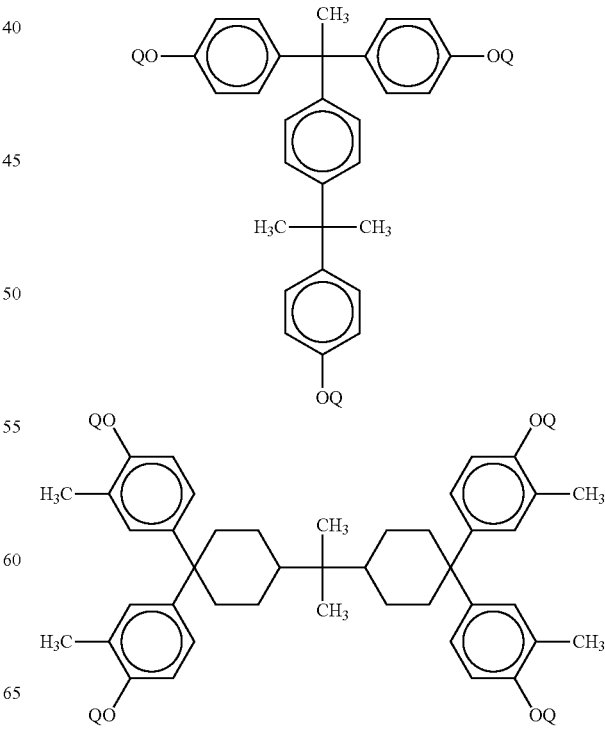

-continued

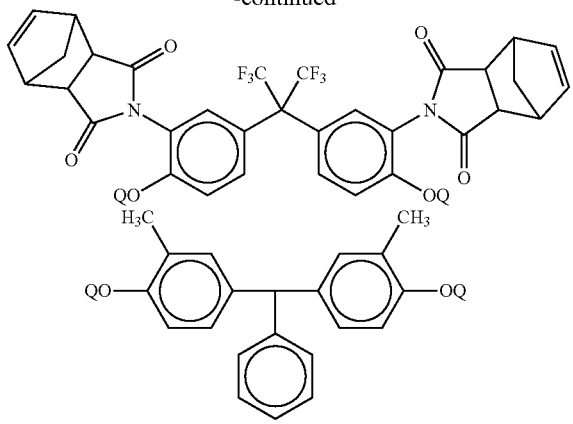

(in which Q is a hydrogen atom or a naphthoquinonediazide sulfonate group represented by the following formula:

[Chemical Formula 3]

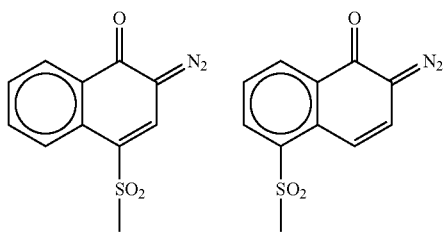

and all Qs are not simultaneously hydrogen atoms).

14. The photopolymer composition according to claim 1, wherein compound (C) has at least two groups selected from the group consisting of an epoxy group, an oxetane group, a —N—(CH$_2$—OR') group (in which R' is hydrogen or an alkyl group having 1 to 4 carbon atoms), and a —C—(CH$_2$—OR') group (in which R' is hydrogen or an alkyl group having 1 to 4 carbon atoms).

15. The photopolymer composition according to claim 1, further comprising (D) a thermal base-generating agent.

16. A method for manufacturing a semiconductor device, comprising the following steps of:

forming a photopolymer layer consisting of the photopolymer composition according to claim 1 on a semiconductor substrate;

exposing the photopolymer layer to actinic light;

developing the exposed photopolymer layer to obtain a relief pattern; and heating the obtained relief pattern.

17. A semiconductor device manufactured by the method according to claim 16.

18. A method for manufacturing a semiconductor element surface protective film or an interlayer insulating film by using the photopolymer composition according to claim 1.

19. A method of manufacturing a semiconductor element surface protective film or an interlayer insulating film by using the photopolymer composition according to claim 1.

* * * * *